(12) United States Patent
Mezic et al.

(10) Patent No.: US 10,474,177 B2
(45) Date of Patent: Nov. 12, 2019

(54) SYSTEM AND METHOD FOR STABILITY MONITORING, ANALYSIS AND CONTROL OF ELECTRIC POWER SYSTEMS

(71) Applicant: THE REGENTS OF THE UNIVERSITY OF CALIFORNIA, Oakland, CA (US)

(72) Inventors: Igor Mezic, Goleta, CA (US); Yoshihiko Susuki, Kyoto (JP)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 0 days.

(21) Appl. No.: 15/940,511

(22) Filed: Mar. 29, 2018

(65) Prior Publication Data
US 2019/0050015 A1    Feb. 14, 2019

Related U.S. Application Data

(63) Continuation of application No. 14/859,012, filed on Sep. 18, 2015, now abandoned.

(60) Provisional application No. 62/052,269, filed on Sep. 18, 2014.

(51) Int. Cl.
| G01R 21/00 | (2006.01) |
| G05F 1/66 | (2006.01) |
| H02J 13/00 | (2006.01) |
| H02J 3/28 | (2006.01) |
| G01R 19/25 | (2006.01) |

(52) U.S. Cl.
CPC ............. *G05F 1/66* (2013.01); *H02J 3/28* (2013.01); *H02J 13/00* (2013.01); *H02J 13/001* (2013.01); *G01R 19/2513* (2013.01); *Y02E 60/74* (2013.01); *Y04S 10/30* (2013.01); *Y04S 10/40* (2013.01)

(58) Field of Classification Search
CPC ..................................... G05F 1/66; H02J 3/28
USPC ........................................ 702/60, 79, 81, 84
See application file for complete search history.

(56) References Cited

U.S. PATENT DOCUMENTS

| 2006/0261942 A1* | 11/2006 | Frank | G01T 1/167 340/539.26 |
| 2012/0143516 A1* | 6/2012 | Mezic | G05B 15/02 702/24 |
| 2016/0094898 A1* | 3/2016 | Primm | H04Q 9/00 340/870.09 |
| 2016/0196299 A1* | 7/2016 | Allen | G06F 17/30964 707/776 |

* cited by examiner

*Primary Examiner* — Connie C Yoha
(74) *Attorney, Agent, or Firm* — Gates & Cooper LLP

(57) ABSTRACT

A system and method for stability monitoring, analysis, and control of energy systems, such as electric power systems, is provided. Specifically, the system and method described herein use a Koopman mode analysis to represent the operation of individual components in an energy system and/or to determine and rank a level of stability of the individual components in the energy system. The system and method described herein also use a Koopman mode analysis to determine optimal and/or safe times to release energy stored in storage systems.

22 Claims, 9 Drawing Sheets

SYSTEM AND METHOD FOR STABILITY MONITORING, ANALYSIS AND CONTROL OF ELECTRIC POWER SYSTEMS

CROSS-REFERENCE TO RELATED APPLICATIONS

This application is a continuation under 35 U.S.C. § 120 of U.S. Utility patent application Ser. No. 14/859,012, entitled "SYSTEM AND METHOD FOR INSTABILITY MONITORING, ANALYSIS AND CONTROL OF ELECTRIC POWER SYSTEMS" and filed on Sep. 18, 2015, now abandoned, which application claims priority under 35 U.S.C. § 119(e) to U.S. Provisional Patent Application No. 62/052,269, entitled "METHOD FOR INSTABILITY MONITORING, ANALYSIS AND CONTROL OF ELECTRIC POWER SYSTEMS" and filed on Sep. 18, 2014, the entire disclosure of which is hereby incorporated by reference.

This application is related to the following co-pending and commonly-assigned applications:

U.S. Pat. No. 9,043,163, filed on Aug. 4, 2011, by Igor Mezic and Bryan A. Eisenhower, and entitled "SYSTEMS AND METHODS FOR ANALYZING BUILDING OPERATIONS SENSOR DATA,", which patent claims the benefit under 35 U.S.C. Section 119(e) of U.S. Provisional Patent Application Ser. No. 61/371,432, filed on Aug. 6, 2010, by Igor Mezic and Bryan A. Eisenhower, and entitled "SYSTEMS AND METHODS FOR ANALYZING BUILDING OPERATIONS SENSOR DATA,"; and U.S. patent application Ser. No. 14/745,140, filed on Jun. 19, 2015, by Michael V. Georgescu and Igor Mezic, and entitled "ENERGY INFRASTRUCTURE DATA RECTIFICATION USING MACHINE LEARNING METHODS,";

which applications are incorporated by reference herein.

STATEMENT REGARDING FEDERALLY SPONSORED RESEARCH AND DEVELOPMENT

This invention was made with Government support under Grant Nos. AFOSR FA9550-09-1-0141 awarded by the Air Force Office of Scientific Research (AFOSR) and ARO W911NF-11-1-0511 awarded by the Army Research Office (ARO). The Government has certain rights in this invention.

TECHNICAL FIELD

This invention relates to a method for stability (or instability) monitoring, analysis and control of electric power systems.

BACKGROUND

The nation's electric power system is a large-scale, networked, and heterogeneous system with multi-scale physics, in which electrical energy is generated and supplied to consumers in a generally safe and reliable manner. The existing electric power system has a long history of commercial operation of more than 100 years.

Currently, the existing system is being modernized by integrating power technology with information and communications technology, referred to as the "Smart Grid." The "Smart Grid" vision aims to design the next architecture of the power system that operates in an energy-efficient way, handles renewable energy sources (solar and wind energy), and achieves a robust electricity supply resistant against cyber-security attacks and physical instabilities.

Examples of physical instabilities include the US and Canada blackout on Aug. 14, 2003, where an estimated 50 million people were affected, and 61,800 megawatts (MW) of electric load were lost. Estimates of total costs in the United States for this incident are between 4 billion and 10 billion US dollars.

SUMMARY

To overcome the deficiencies described herein, the present disclosure provides a system and method for stability monitoring, analysis, and control of energy systems, such as electric power systems. Specifically, some embodiments of the system and method described herein use a spectral analysis (e.g., a modal decomposition, such as Koopman mode analysis) to represent the operation of individual components in an energy system and/or to determine and rank a level of stability or instability of the individual components.

One aspect of the disclosure provides a system for stability monitoring, analysis, and control in an energy system. The system comprises a computer data repository configured to store physical data measured by at least one physical sensor. The system further comprises a computing system comprising one or more computing devices, the computing system in communication with the computer data repository and programmed to implement: an stability analyzer configured to: retrieve the physical data from the computer data repository, where the physical data corresponds to a first power entity, and where the physical data comprises data of a first type; determine a plurality of growth rate values and a plurality of frequency values associated with the first power entity using the retrieved physical data and a spectral analysis technique, where each growth rate value in the plurality of growth rate values is associated with a frequency in a range of frequencies, and where each frequency value in the plurality of frequency values is associated with a frequency in the range of frequencies; determine a level of stability of the first power entity based on at least one growth rate value in the plurality of growth rate values; and generate user interface data for rendering a user interface on a computing device, where the user interface data comprises a representation of the first power entity and an indication of the determined level of stability of the first power entity.

The system of the preceding paragraph can have any sub-combination of the following features: where the stability analyzer is further configured to assign a stability rank to the first power entity based on the determined level of stability of the first power entity, where the indication of the determined level of stability comprises an indication of the assigned stability rank; where a first color corresponds with the assigned stability rank, and where the representation of the first power entity is depicted in the first color; where the spectral analysis technique comprises a Koopman mode analysis; where the stability analyzer is further configured to receive, from a user, a request to adjust an actuator controlling the first power entity; where the user interface data further comprises a list of selectable frequencies, and a list of selectable data types, and where the stability analyzer is further configured to: determine a plurality of amplitudes and a plurality of phases associated with the first power entity using a Koopman mode analysis applied to the retrieved physical data, where each amplitude in the plurality of amplitudes is associated with a frequency in the range of frequencies, and where each phase in the plurality of phases is associated with a frequency in the range of frequencies, and update, in response to a selection of a first frequency within the list of selectable frequencies and a selection of the first type within the list of selectable data types, the user interface data to include, in association with the representation of the first power entity, a representation of the amplitude in the plurality of amplitudes that is associated with the first frequency; where the stability analyzer is further configured to: retrieve a stability limit associated with the first power entity, determine a time when the first power entity will reach the stability limit based on the plurality of growth rate values, the plurality of frequency values, and the plurality of amplitudes, generate an alert indicating the determined time, and update the user interface data to include the alert; where the stability analyzer is further configured to: generate a control sequence based on the determined plurality of phases, and transmit the control sequence to a control system such that the control system can adjust operation of the first power entity; where the control sequence includes an instruction that causes the first power entity to adjust operation in a way that opposes instability identified in the energy system; where the user interface data comprises one of a geographical map, a grip map, or a system schematic, and where the representation of the first power entity is positioned in the user interface over the one of the geographical map, the grip map, or the system schematic at a location that corresponds with a physical location of the first power entity; where the physical data comprises at least one of a value of voltages generated by the first power entity, a phase of the voltages generated by the first power entity, a value of current generated by the first power entity, a power level output by the first power entity, reactive power, apparent power, power quality, rotor angular position of a power source, rotor angular velocity of a power source, rotor frequency of a power source, mechanical input power of a power source, an amount of power demanded by the first power entity, an amount of power consumed by the first power entity, or social data; where the stability analyzer is further configured to generate a control sequence that causes a storage system to release energy into the energy system based on the determined level of stability of the first power entity; and where the first power entity is one of a power source or a power sink.

Another aspect of the disclosure provides a method for stability monitoring, analysis, and control in an energy system. The method comprises, as implemented by a computer system comprising one or more computing devices, the computer system configured with specific executable instructions, retrieving physical data, where the physical data is measured by at least one physical sensor and corresponds to a first power entity, and where the physical data comprises data of a first type; determining a plurality of growth rate values associated with the first power entity using the retrieved physical data and a spectral analysis technique, where one or more individual growth rate values in the plurality of growth rate values are associated with a frequency in a range of frequencies; determining a level of stability of the first power entity based on at least one growth rate value in the plurality of growth rate values; and generating user interface data for rendering a user interface on a computing device, where the user interface data comprises a representation of the first power entity and an indication of the determined level of stability of the first power entity.

The method of the preceding paragraph can have any sub-combination of the following features: where the method further comprises assigning a stability rank to the first power entity based on the determined level of stability of the first power entity, where the indication of the determined level of stability comprises an indication of the assigned stability rank; where a first color corresponds with the assigned stability rank, and where the representation of the first power entity is depicted in the first color; where the spectral analysis technique comprises a Koopman mode analysis; where the method further comprises receiving, from a user, a request to adjust an actuator controlling the first power entity; where the user interface data further comprises a list of selectable frequencies, and a list of selectable data types, and where the method further comprises: determining a plurality of amplitudes associated with the first power entity using a Koopman mode analysis applied to the retrieved physical data, where one or more individual amplitudes in the plurality of amplitudes are associated with a frequency in the range of frequencies, and updating, in response to a selection of a first frequency within the list of selectable frequencies and a selection of the first type within the list of selectable data types, the user interface data to include, in association with the representation of the first power entity, a representation of the amplitude in the plurality of amplitudes that is associated with the first frequency; where the method further comprises retrieving a stability limit associated with the first power entity, determining a time when the first power entity will reach the stability limit based on the plurality of growth rate values and the plurality of amplitudes, generating an alert indicating the determined time, and updating the user interface data to include the alert; and where the method further comprises generating a control sequence based on the determined plurality of amplitudes, and transmitting the control sequence to a control system such that the control system can adjust operation of the first power entity.

Another aspect of the disclosure provides a non-transitory computer-readable medium having stored thereon an stability analyzer for determining stability of power entities, the stability analyzer comprising executable code that, when executed on a computing device, implements a process comprising: retrieving physical data, where the physical data is measured by at least one physical sensor and corresponds to a first power entity, and where the physical data comprises data of a first type; determining a plurality of growth rate values associated with the first power entity using the retrieved physical data and a spectral analysis technique, where one or more individual growth rate values in the plurality of growth rate values is associated with a frequency in a range of frequencies; determining a level of stability of the first power entity based on at least one growth rate value in the plurality of growth rate values; and generating user interface data for rendering a user interface on a computing device, where the user interface data comprises a representation of the first power entity and an indication of the determined level of stability of the first power entity.

BRIEF DESCRIPTION OF THE DRAWINGS

Referring now to the drawings in which like reference numbers represent corresponding parts throughout.

DETAILED DESCRIPTION OF SPECIFIC EMBODIMENTS

Figure 1:
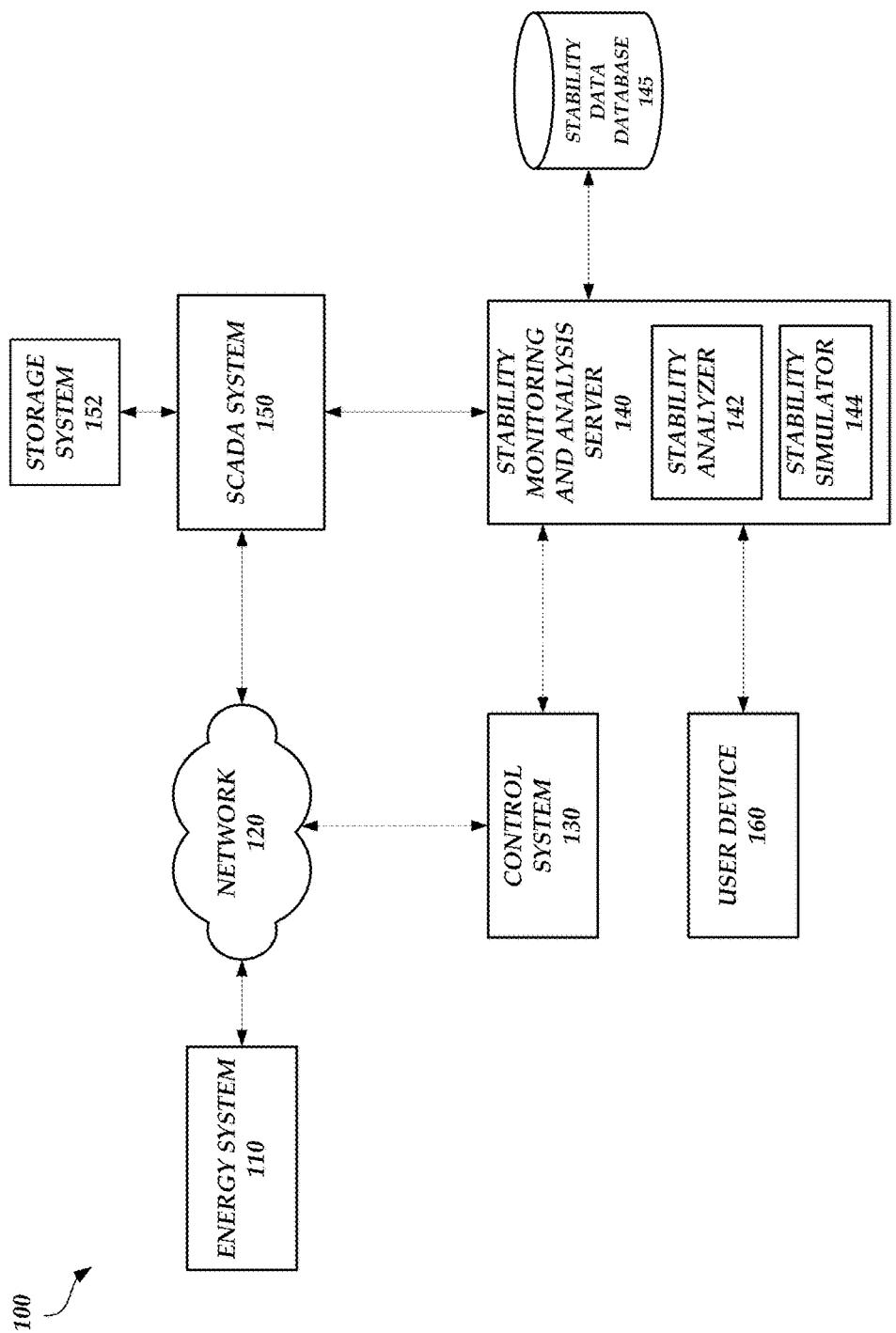
FIG. 1 illustrates a block diagram showing the various components in an electric power stability analysis system.

In the following description of the preferred embodiment, in which is shown a specific embodiment of the disclosure, it is to be understood that other embodiments may be utilized and structural changes may be made without departing from the scope of the present disclosure.

Overview

As noted above, physical instabilities in the power system can be costly. It has been widely accepted that the lack of accuracy of the measurement of power system (dynamic) states is one important cause of blackouts or other issues with the existing power system (also referred to herein as the power grid).

Many methods for stability assessment of power systems have been developed. Traditional methods are mainly model-based; that is, the stability assessment is performed by investigating a mathematical model that represents the target dynamics of a power system. However, it is widely recognized that cascading outages are fairly complicated emergent phenomena in high-dimensional nonlinear dynamical systems. For example, cascading outages may be as a result of the relative instability of certain components within a power system and the traditional mathematical models do not provide any framework for quantifying the stability of individual components within the power system. Rather, the traditional mathematical models merely provide a framework for taking a preset model of the topology of a power system and using a physics-based approach to simulate the power system as a whole. Therefore, it is difficult to obtain a mathematical model that explains all events and the time evolution of a cascading outage. Even if one could obtain such a model, it would be not easy to gain a dynamical insight into the cascading outages from the model because of the model's complexity. Also, the large increase of renewable or alternative energy sources (e.g., wind, solar, hydroelectric, etc.) makes it hard to obtain a relevant deterministic model because of the uncertain nature of when renewable energy sources may be providing energy to the power system (e.g., the output of renewable energy sources may be dependent on weather, which can vary hour by hour).

In addition, commercial and residential buildings, which consume 42% of the total energy in the U.S., are entangled with the power grid by an information network intended to maintain safe and efficient operation of the buildings and the grid. However, the grid-building interactions are currently rare, simple, and one-way, which means that connections between buildings and the power grid may not be able to adequately handle extreme fluctuation in demand or unpredictable supply, resulting in grid instability and energy management inefficiency (e.g., energy usage and/or energy production inefficiency).

Moreover, there is the need for more advanced control algorithms to manage the grid-buildings interaction so that buildings do not have to revert to extremes in energy usage and can employ targeted reductions in energy usage that maintain grid stability and the comfort of occupants, such as described in Duncan S Callaway, "Tapping the energy storage potential in electric loads to deliver load following and regulation, with application to wind energy," Energy Conversion and Management, 50(5):1389{1400, 2009, which is hereby incorporated herein by reference in its entirety. This situation becomes more complex with the addition of alternative energy sources, leading to more severe uncertainty management issues.

The systems operating in large buildings and the power grid system are nonlinear and complex. A tight integration of the two complex nonlinear systems can lead to emerging effects that cannot be understood or controlled from the decoupled perspective, such as described in Alain Barrat, Marc Barthelemy, and Alessandro Vespignani. Dynamical processes on complex networks, volume 1. Cambridge University Press Cambridge, 2008 and in Marko Budisic, Ryan Mohr, and Igor Mezic. Applied Koopmanism. Chaos: An Interdisciplinary Journal of Nonlinear Science, 22(4): 047510{047510, 2012, which are hereby incorporated by reference in their entireties.

Moreover, enhanced demand-response protocols, such as those described in Piette, Mary Ann, "Open automated demand response communications specification (Version 1.0)," Lawrence Berkeley National Laboratory (2009), which is hereby incorporated by reference in its entirety, are needed for the grid-buildings complex networked system dynamics monitoring and control. These protocols could be implemented at the grid side or in middleware that couples the building management system (BMS) with the power grid for demand elasticity across multiple time scales with guaranteed levels of energy savings, comfort, security and grid stability.

Thus, there is a need for improved systems and methods for stability monitoring, analysis, and control of electric power systems. Accordingly, in contrast to the model-based approach, some embodiments of a system and method are provided herein that use a spectral analysis (e.g., a modal decomposition, such as Koopman mode analysis) to represent the operation of individual components in an energy system and/or to determine and rank a level of stability of the individual components. Specifically, standard supervisory control and data acquisition (SCADA) systems continuously collect physical information of an energy system's state and distribute such information to system operators. Such information may include the value of voltages generated by a power source (e.g., a power plant, a solar panel, a wind farm, a generator, etc.), the phase of the voltages generated by a power source, the value of current generated by a power source, the power level output by a power source, reactive power of a power source, apparent power of a power source, power quality (e.g., a measurement describing the variability of voltage produced in the power grid, which may indicate how susceptible a power grid is to brown outs or power surges), rotor angular position of a power source (e.g., a power source that generates power from a dynamo, such as power generators, wind turbines, hydroelectric generators, etc.), rotor angular velocity of a power source (e.g., a power source that generates power from a dynamo, such as power generators, wind turbines, hydroelectric generators, etc.), rotor frequency of a power source (e.g., a power source that generates power from a dynamo, such as power generators, wind turbines, hydroelectric generators, etc.), mechanical input power of a power source (e.g., how much energy can be derived from the wind source if the power source is a wind turbine, how much energy can be derived from the flow (e.g., based on speed of the flow) if the power source is hydroelectric, etc.), the amount of power demanded by individual power sinks (e.g., buildings or other components that consume energy generated by a power source) and/or power sinks in the aggregate, the amount of power consumed by individual power sinks and/or power sinks in the aggregate, and/or the like. For example, recent advances in real-time phasor measurement units (PMUs) offer an advanced data collection method that can be used to collect the phases of the AC voltages generated by a power source. Some or all of the physical information collected by the SCADA systems may be used in the Koopman mode analysis to represent the operation of the individual components in the energy system (e.g., as amplitudes and phases) and/or to determine and rank the level of stability of the individual components.

Once the operation is represented and/or the level of stability for the individual components in the energy system are determined, the system and method described herein can determine when an individual component may be expected to fail, suggest changes in how power resources are allocated (e.g., via an interactive user interface), and/or automatically control actuators (e.g., by generating control sequences or algorithms) to reallocate power resources among the individual components in the energy system. For example, the system and method described herein may provide advanced control algorithms to manage the grid-buildings interaction so that buildings may not have to revert to extremes in energy usage and can employ targeted reductions that maintain grid stability and the comfort of occupants. These algorithms may be implemented by a system on the grid side or by a system that couples the BMS with the power grid for demand elasticity across multiple time scales with guaranteed levels of energy savings, comfort, security, and/or grid stability. For example, the systems and methods presented herein may be used to determine optimal, safe times to release energy stored in storage devices (e.g., batteries, flywheels, compressed air systems, electric cars, and/or other storage systems) based on amplitudes, phases, and/or frequencies of selected Koopman modes.

The system and method described herein may also use the stability analysis to simulate the distribution of power resources under different demand conditions, blackout scenarios, future capacity requirements, and/or the costs associated with energy generation (e.g., to determine the most efficient way to minimize energy use during periods of high cost). For example, the system and method described herein may generate an interactive user interface that displays the results of a simulation. The interactive user interface may allow a user to select different parameters to change the behavior of one or more components in the energy system.

The benefits of the system and method described herein may include any of the following:
- An in-depth analysis of dynamic phenomena in power systems to identify the degree of stability and an N−1 security measure of reliability;
- The use of algorithms for the identification of a set of dominant components or modes from actual physical data measured in real power systems;
- The implementation of monitoring systems in central control centers of existing and future power systems in order to provide system operators with a real-time automated system of analysis and control;
- An in-depth situational analysis of new and retrofit power grid design to optimize energy usage while reducing control inefficiencies and faults and/or to minimize capital investment while maximizing an entity's return on investment (ROI);
- Self-commissioning tools for implementation in retrofits in order to provide for gains in efficiency based on improved sensing and fast network-accessible algorithms for fault detection and schedule optimization using modal information; and/or
- Self-commissioning of power systems using a network-accessible analysis of the modal behavior of the power systems.
- Determination of optimal, safe times to release energy stored in storage devices (e.g., batteries, fly wheels, compressed air systems, and/or other storage systems) based on amplitudes, phases, and/or frequencies of selected Koopman modes.

While components are described herein as being either power sources or power sinks, note that some components may be both power sources and power sinks. For example, a house with solar panels may be a power source at times (e.g., when the solar panels are providing power to the power grid) and may be a power sink at other times (e.g., when the solar panels are not providing power to the power grid and the house is consuming power from the power grid). Thus, for simplicity, components are described as being a power source if they are a net power source (e.g., the components contribute more energy to the grid than they receive) and are described as being a power sink of they are a net power sink (e.g., the components receive more energy from the grid than they contribute).

System Overview

FIG. 1 illustrates a block diagram showing the various components in an electric power stability analysis system 100. As illustrated in FIG. 1, the electric power stability analysis system 100 comprises an energy system 110, a control system 130, an stability monitoring and analysis server 140, an stability data database 145, a SCADA system 150, a storage system 152, and a user device 160.

The energy system 110 may be at least one of a variety of power sources and power sinks coupled via a power grid. For example, the energy system 110 may include structures or components, such as one or more buildings, one or more industrial processes (e.g., a factory), one or more vehicles, one or more renewable energy or power sources (e.g., hydroelectric, solar, wind, etc.), one or more conventional energy or power sources (e.g., generators, natural gas power plants, nuclear power plants, coal power plants, etc.), one or more storage systems (e.g., batteries, flywheels, compressed air systems, electric cars, etc.), and/or the like. The energy system 110 may include various sensors (e.g., thermostats, humidistats, utility meters, etc.) that measure physical data. The physical data may comprise an environmental aspect, such as temperature or humidity, but may also comprise a system aspect, such as the value of voltages generated by a power source (e.g., a power plant, a solar panel, a wind farm, etc.), the phase of the voltages generated by a power source, the value of current generated by a power source, the power level output by a power source, reactive power, apparent power, power quality, rotor angular position of a power source (e.g., a power source that generates power from a dynamo, such as power generators, wind turbines, hydroelectric generators, etc.), rotor angular velocity of a power source (e.g., a power source that generates power from a dynamo, such as power generators, wind turbines, hydroelectric generators, etc.), rotor frequency of a power source (e.g., a power source that generates power from a dynamo, such as power generators, wind turbines, hydroelectric generators, etc.), mechanical input power of a power source (e.g., how much energy can be derived from the wind source if the power source is a wind turbine, how much energy can be derived from the flow (e.g., based on speed of the flow) if the power source is hydroelectric, etc.), the amount of power demanded by individual power sinks (e.g., buildings or other components that consume energy generated by a power source, storage systems, etc.) and/or power sinks in the aggregate, the amount of power consumed by individual power sinks and/or power sinks in the aggregate, and/or the like. The physical data can also include social data, such as a number of users (e.g., customers of a power source) and/or the energy needs of one or more users at particular times of the day, the week, the month, the year, and/or the like. The readings from the sensors may also be converted to an appropriate form to facilitate analysis. For example, a sensor may record a change in temperature or a change in humidity, or may instead record an integral of these values over a period of time. Alternatively, a computer system can perform this post-processing on the raw sensor data.

Each sensor in the energy system 110 may store information locally. Alternatively or in addition, one or more sensors may transmit the measured information to a central system within the energy system 110. Those sensors that communicate their information may be wireless or wired. Certain embodiments contemplate the sensors comprising an ad hoc infrastructure facilitating the transmission of readings to a central system. In certain embodiments comprising wireless sensors, routers within the energy system 110 may be used to collect data from local sensors and pass them on to the central system.

The SCADA system 150 may include a control system that operates over communication channels to provide a user or operator with control over remote equipment. The SCADA system 150 may also include a data acquisition system that acquires and stores status information of the remote equipment. For example, the SCADA system 150 may allow for the control of structures or components within the energy system 110 (e.g., via control sequences) and may acquire and store the physical data measured by sensors of the energy system 110. Similarly, the control system 130 also allows for the control of structures or components within the energy system 110 (e.g., via received control sequences).

The SCADA system 150 may be in communication with the energy system 110 via a network 120. The network 120 may be a publicly accessible network of linked networks, possibly operated by various distinct parties, such as the Internet. In other embodiments, the network 120 may include a private network, personal area network, local area network, wide area network, cable network, satellite network, cellular telephone network, etc. or combination thereof, each with access to and/or from the Internet.

The storage system 152 may be in communication with the SCADA system 150 via another network similar to the network 120 (not shown) or via the network 120. The storage system 152 is configured to store energy and release energy to one or more power sinks in the energy system 110 when instructed to do so by the SCADA system 150 and/or the control system 130. The storage system 152 can be one or more batteries, flywheels, compressed air systems, electric cars, and/or the like. In other embodiments, not shown, the storage system 152 is a part of the energy system 110.

The stability monitoring and analysis server 140 may be in communication with the SCADA system 150 via another network similar to the network 120 (not shown). The stability monitoring and analysis server 140 may include one or more programmed computing devices (which may be geographically distributed), each of which may include a processor and memory. For example, the stability monitoring and analysis server 140 may include various components, such as an stability analyzer 142 and an stability simulator 144. The stability analyzer 142 and the stability simulator 144 may each be implemented as executable code modules that are stored in the memory of, and executed by the processor(s) of, the stability monitoring and analysis server 140. The stability analyzer 142 and the stability simulator 144 may also be implemented partly or wholly in application-specific hardware.

The stability analyzer 142 may be configured to use a Koopman mode analysis to represent the operation of power sources and/or power sinks in the energy system 110 and/or to determine and rank a level of stability of the power sources and/or power sinks. For example, the stability analyzer 142 may receive physical data measured by the sensors of the energy system 110 via the SCADA system 150 and store such data in the stability data database 145. Alternatively, not shown, the SCADA system 150 may directly store the physical data in the stability data database 145 and the stability monitoring and analysis server 140 may retrieve such data from the stability data database 145. The stability analyzer 142 may then perform the Koopman mode analysis using some or all of the physical data received over a set period of time. The Koopman mode analysis may produce sets of amplitudes and phases that may represent the operation of a power source and/or power sink associated with the physical data used in the analysis, where each set of amplitudes and phases is associated with a frequency. The Koopman mode analysis may also produce a growth rate value (e.g., a value indicating whether the amplitude of an oscillating signal representing a physical data parameter is increasing, decreasing, or staying the same) and a frequency value (e.g., a frequency of oscillation of the signal representing the physical data parameter) that can be correlated with a level of stability (or instability). In some embodiments, the stability analyzer 142 performs a separate Koopman mode analysis for each power source and/or power sink in the energy system 110 so that the representation of operation and the level of stability can be determined on an individual power source and/or power sink basis. The power sources and/or power sinks can then be ranked based on their relative level of stability. The Koopman mode analysis performed by the stability analyzer 142 is described in greater detail below. The stability monitoring and analysis server 140 may transmit the determined operation representation and/or rankings to the user device 160 for display and analysis.

In further embodiments, the stability analyzer 142 is configured to use the determined operation representation and levels of stability to estimate when an individual power source and/or power sink may be expected to fail. For example, each power source and/or power sink may have a stability limit that, when reached, causes the respective power source or power sink to fail. The stability analyzer 142 may use the growth rate value and/or the frequency value along with the amplitudes and phases to estimate when the stability limit would be reached if current trends continued.

The stability analyzer 142 may further be configured to suggest changes in how power resources are allocated. For example, the stability analyzer 142 may use the represented operation (e.g., the amplitudes and phases) and/or the determined levels of stability to determine power sources and/or power sinks that are in danger of failing (e.g., based on the stability limit of the power source or power sink) and providing a notification (e.g., via an interactive user interface) to a user with a suggestion for reallocating power resources such that the power sources and/or power sinks are less likely to be in danger of failing. In addition to providing the notification or alternatively, the stability analyzer 142 may be configured to automatically control actuators (e.g., via the generation of control sequences or algorithms that are transmitted to the SCADA system 130 or a separate control system 130) to reallocate power resources among the individual components in the energy system (e.g., to reduce the likelihood that a power source and/or power sink fails). Such control sequences may include instructing the SCADA system 150 or the separate control system 130 to shut down or reduce the energy output or energy input of an unstable power source and/or power sink or other power sources and/or power sinks that affect the unstable power source and/or power sink. Such control sequences may also include instructing the SCADA system 150 or the separate control system 130 to modify the behavior of such unstable or related power sources and/or power sinks in a way that cancels or opposes the underlying instability of the unstable power source and/or power sink (e.g., modifying the behavior in a way that generates a Koopman mode distributed shape to oppose the distributed shape of the underlying unstable Koopman mode of the unstable power source and/or power sink). For example, the stability analyzer 142 may provide advanced control algorithms to manage the interaction between the power grid and buildings so that buildings may not have to revert to extremes in energy usage (e.g., a sizeable reduction in energy usage in response to an indication that energy supplied by the power grid is low) and can employ targeted reductions in energy usage that maintain both power grid stability and the comfort of occupants. In addition, the stability analyzer 142 may provide advanced control algorithm(s) that determine the amount and/or scheduling of energy to be stored in storage systems. While these algorithms are described as being implemented by the stability monitoring and analysis server 140, this is not meant to be limiting. These algorithms may be implemented by a system on the power grid side (e.g., in the energy system 110, not shown), by a system that couples the BMS of a building with the power grid (e.g., in the energy system 110, not shown), or by the SCADA system 150 that acquires data and controls the storage system 152.

The stability analyzer 142 may perform any of the tasks described above using actual, historical physical data, simulated physical data, and/or a combination of historical and simulated physical data. For example, the stability analyzer 142 may use simulated physical data to validate that the Koopman mode analysis is providing the correct or desired results.

The stability simulator 144 may use the represented operation and/or the levels of stability determined by the stability analyzer 142 to simulate various scenarios. For example, the stability simulator 144 may simulate the distribution of power resources under different demand conditions (e.g., a steady state response condition in which demand is assumed to remain constant, a demand response condition in which demand varies over time in response to, for example, changing weather or climate, different storage system conditions, etc.). As another example, the stability simulator 144 may simulate a blackout scenario, including the occurrence of a blackout and the restart of various power sources and/or power sinks in the energy system 110. Generally, the energy system 110 may be segmented into smaller networks of power sources and/or power sinks of similar capacity and restarted individually after a blackout occurs. Once the smaller networks are functioning and stable, the networks can be bridged to fully restore the operation of the energy system 110. Thus, the stability simulator 144 may simulate the blackout, the restart of the smaller networks, and/or the bridging of the smaller networks. As another example, with the introduction of new technologies that influence power grid energy use, such as electric transportation or solar power generation, new types of fluctuations may be introduced into the energy supply and/or demand. Thus, the stability simulator 144 may simulate and forecast future capacity requirements. As another example, the cost of energy may change continuously over the course of a day due to energy supply and/or demand (e.g., energy may be cheaper at night than during the day). Thus, the stability simulator 144 can simulate the cost such that plans can be developed to minimize energy use during periods of high costs. The stability simulator 144 may execute any of the above-described simulations using stability levels determined from actual, historical physical data, simulated physical data, and/or a combination of historical and simulated physical data.

The stability simulator 144 may generate one or more interactive user interface so that the simulations described above can be displayed to a user. For example, data representing the interactive user interfaces may be transmitted to the user device 160 so that the interactive user interfaces can be displayed by the user device 160. The interactive user interfaces may allow a user to select different parameters to change the behavior of one or more power sources and/or power sinks in the energy system 110.

As described above, the user device 160 may receive determined stability rankings from the stability monitoring and analysis server 140. The user device 160 may display such information in an interactive user interface. Via the user interface, a user may analyze the data to perform a variety of tasks. For example, the stability monitoring and analysis server 140 may determine operation representations and stability rankings for each power source and/or power sink in a subset of the energy system 110. The user interface may allow the user to view the relative location of each of the power sources and/or power sinks in the subset along with the determined amplitudes, phases, and/or stability rankings. The user interface may use color-coding to differentiate between different amplitudes, phases, and/or stability rankings (e.g., via a heat map that includes a gradient of colors that each represent a different amplitude, phase, and/or stability rank value). The user interface may also include notifications that indicate those components that may be in danger of failing and/or that request the user to provide instructions for actions to take (e.g., manually reallocate power resources, allow the stability monitoring and analysis server 140 to automatically send instructions to actuators to avoid failure, etc.).

While a single user device 160 is illustrated in FIG. 1, this is not meant to be limiting. The electric power stability analysis system 110 may include any number of user devices 160. The user devices 160 can include a wide variety of computing devices, including personal computing devices, terminal computing devices, laptop computing devices, tablet computing devices, electronic reader devices, mobile devices (e.g., mobile phones, media players, handheld gaming devices, etc.), wearable devices with network access and program execution capabilities (e.g., "smart watches" or "smart eyewear"), wireless devices, set-top boxes, gaming consoles, entertainment systems, televisions with network access and program execution capabilities (e.g., "smart TVs"), and various other electronic devices and appliances. Individual user devices 160 may execute a browser application or other networked-application to communicate with the stability monitoring and analysis server 140.

The stability data database 145 may store actual, estimated, and/or forecasted physical data. The stability data database 145 may also store determined amplitudes, phases, stability rankings, the stability limits for various power sources and/or power sinks, and/or the results of any simulations executed by the stability simulator 144. The stability data database 145 may be located external to the stability monitoring and analysis server 140. For example, the stability data database 145 may be stored and managed by a separate system or server and may be in communication with the stability monitoring and analysis server 140 via a direct connection or an indirect connection (e.g., via a network, such as the network 120). In other embodiments, not shown, the stability data database 145 is located within the stability monitoring and analysis server 140.

While the electric power stability analysis system of FIG. 1 and the present disclosure is described with respect to energy data, this is merely for illustrative purposes and is not meant to be limiting. The techniques described herein as performed by the stability monitoring and analysis server 140 may be applicable to many other applications. For example, the stability monitoring and analysis server 140 may use the techniques described herein for other applications in which the stability of components in a system may be an issue, such as air and/or ground traffic regulation, network management (e.g., regulation of network traffic, such as Internet traffic), transactional market regulation (e.g., the exchange of assets between institutions), and/or the like.

Techniques Implemented by the Stability Monitoring and Analysis Server 140

As described above, the stability monitoring and analysis server 140 (e.g., the stability analyzer 142) can determine a representation of operation and/or a level of stability for a power source or power sink using a Koopman mode analysis. The Koopman mode analysis may include using a linear Koopman operator to determine Koopman modes, which are coefficients of the projections of observables (e.g., actual and/or simulated physical data in this case) onto the eigenfunctions of the Koopman operator. The Koopman mode analysis may be used by the stability analyzer 142 to determine a set of Koopman modes for an individual power source and/or power sink, where each Koopman mode may be associated with a different frequency or frequency range. Each Koopman mode may be calculated using some or all of the physical data that originated from or is associated with the individual power source and/or power sink associated with the respective Koopman mode. The stability analyzer 142 may repeat the analysis for some or all of the power sources and/or power sinks in the energy system 110.

Generally, the stability analyzer 142 uses physical data sampled at discrete times to calculate the Koopman mode. If, for example, some physical data is missing or not uniformly sampled, the stability analyzer 142 may perform an interpolation using the existing physical data to fill in the missing physical data before performing the calculation. Alternatively, the stability analyzer 142 may use simulated physical or past historical physical data (e.g., physical data that otherwise does not correspond to the same time frame as the received physical data from the SCADA system 150) to fill in the missing physical data before performing the calculation.

The stability analyzer 142 may use the Koopman mode analysis to determine several values associated with the determined Koopman mode that can be used to represent the operation of the power source and/or power sink and to rank the stability of the power source and/or power sink. For example, the analysis may produce Koopman mode amplitudes, Kopman mode phases, growth rate values, and/or frequency values. Techniques implemented by the stability analyzer 142 to produce these values are described below.

Koopman modes and the eigenfunctions can be computed directly by the stability analyzer 142 using a generalized Laplace analysis, as described in Mezic, Igor, "Analysis of fluid flows via spectral properties of the Koopman operator," Annual Review of Fluid Mechanics 45 (2013): 357-378, which is hereby incorporated by reference herein in its entirety. Given a finite dimensional nonlinear system, $f$, with access to observables $g(x_j)$, the Koopman operator may be defined by the stability analyzer 142 as follows:

$$U(g(x_j)) = g(f(x_j)) = g(x_{j+1}) \qquad (1)$$

where x is a variable presenting a physical data parameter (e.g., the physical data collected by the SCADA system 150) and the Koopman operator is linear and may capture nonlinear, finite-dimensional dynamics on the space of observables. The stability analyzer 142 may further define the observable using the following expression:

$$g(x) = \sum_{k=1}^{\infty} \lambda_k \psi_k(x) v_k \qquad (2)$$

where $\lambda_k$ represents eigenvalues, $\psi_k$ represents eigenfunctions, x represents physical data values, and $v_k$ represents a set of vectors called Koopman modes. Equation (2) is described in greater detail in Yoshihiko Susuki and Igor Mezic, "Nonlinear Koopman Modes and Power System Stability Assessment Without Models," IEEE Transactions on Power Systems, Vol. 29, No. 2, Nov. 6, 2013, which is hereby incorporated by reference herein in its entirety.

The Koopman mode $v_k$ can be calculated by the stability analyzer 142 in one of several ways. For example, the stability analyzer 142 can approximate the Koopman mode using the inversion of a Vandermonde type matrix or using the GLA theorem, which is represented by the following equation:

$$v_k = \lim_{m \to \infty} \sum_{i=0}^{m} \lambda_k^{-i} \left( g^i - \sum_{j=0}^{k-1} \lambda_j^i v_j \right) \qquad (3)$$

where g represents different sensors that collected physical data, i represents time, and j represents a data sample.

As another example, the stability analyzer 142 may calculate the Koopman mode $v_k$ by taking a Laplace average of observables (e.g., actual and/or simulated physical data) over a spatial field, as described in greater detail in Yoshihiko Susuki and Igor Mezic, "Nonlinear Koopman Modes and a Precursor to Power System Swing Instabilities," IEEE Transactions on Power Systems, Vol. 27, No. 3, August 2012, which is hereby incorporated herein by reference in its entirety. For example, assuming that the absolute value of the eigenvalues is 1, the Laplace average of observables may be represented as follows:

$$g_\omega^*(x) = \lim_{m \to \infty} \frac{1}{n} \sum_{j=0}^{n-1} e^{i2\pi j\omega} g(x_j) \qquad (4)$$

where ω represents a frequency associated with the Koopman mode being calculated, j identifies a data sample, $g(x_j)$ represents the magnitude of the jth physical data sample (e.g., actual and/or simulated physical data), and $e^{i2\pi j\omega}$ represents the jth eigenvalue at frequency ω. The stability analyzer 142 may use Equation (4) to determine a Laplace average for each type of physical data (or a subset of each type of physical data) that originates from or is associated with the power source and/or power sink being analyzed. For example, if the SCADA system 150 collected voltage values generated by a generator, the phase of voltages generated by the generator, and current values generated by the generator, then the stability analyzer 142 may determine a first Laplace average using the voltage values, a second Laplace average using the phase information, and a third Laplace average using the current values.

Because the eigenvalue may include both a real and imaginary component, the stability analyzer 142 can take the magnitude of a Laplace average to determine an amplitude and can take an angle of a Laplace average to determine a phase. The stability analyzer 142 can repeat these steps for each Koopman mode associated with a power source and/or power sink. Thus, the stability analyzer 142 may generate a matrix of amplitudes and a matrix of phases for the power source and/or power sink, where a column in the matrix may identify a frequency (e.g., which corresponds with a Koopman mode) and a row in the matrix may identify a type of physical data, and the matrix may be filled with corresponding amplitude or phase values (the rows and columns can be interchanged as well). Some or all of the pairs of determined amplitudes and phases may then be used to represent the operation of the power source and/or power sink and/or to compare the operation with other power sources and/or power sinks. For example, the stability analyzer 142 may generate a user interface (e.g., viewable on the user device 160) to display such data for one or more power sources and/or power sinks, as described below with respect to FIGS. 2A-2G. The amplitudes and phases can be organized by power source and/or power sink, by physical data type, by frequency, and/or the like.

In addition, the stability analyzer 142 may use the results of the Koopman mode calculation to rank the stability of a power source and/or power sink. For example, the eigenvalue $\lambda_k$ of Equation (2) may indicate whether the amplitude of an oscillating signal corresponding to a physical data type is increasing, decreasing, or staying the same (e.g., a growth rate value) and the eigenvalue may also indicate the frequency of the oscillating signal. The stability analyzer 142 may take the magnitude of the eigenvalue to identify the growth rate value and an angle of the eigenvalue to identify the frequency of oscillation.

Several techniques may be implemented by the stability analyzer 142 to determine the eigenvalue $\lambda_k$ of Equation (2). For example, the stability analyzer 142 may use variants of the standard Arnoldi algorithm based on companion matrices. This variant may not require an explicit representation of the Koopman operator or the underlying dynamical system and may only require the physical data, such as described in Rowley, Clarence W., et al., "Spectral analysis of nonlinear flows," Journal of Fluid Mechanics 641 (2009): 115-127 and Susuki, Yoshihiko, and Igor Mezic, "Nonlinear Koopman Modes and Power System Stability Assessment Without Models," (2014): 1-9, which are hereby incorporated by reference herein in their entireties. Variants of this algorithm implemented by the stability analyzer 142 may use different techniques to determine the values of the companion matrix as some may only focus on minimizing the residual while others may add additional constraints on the c values, such as sum of c's=1, sum c2 minimal, etc. In some cases, the calculation of the companion matrix may be bypassed completely and an eigenvalue decomposition can instead be directly calculated, such as described in Schmid, Peter J, "Dynamic mode decomposition of numerical and experimental data," Journal of Fluid Mechanics 656 (2010): 5-28, which is hereby incorporated by reference herein in its entirety. In other examples, the stability analyzer 142 uses the extended dynamic mode decomposition (EDMD), which is described in greater detail in Williams et al., "Data Fusion via Intrinsic Dynamic Variables: An Application of Data-Driven Koopman spectral analysis," 109 Europhysics Letters 40007 (2015), which is hereby incorporated by reference herein in its entirety, to determine the eigenvalue $\lambda_k$ of Equation (2). In still further examples, the stability analyzer 142 uses the Prony method, wavelet decomposition, dynamic mode decomposition, Arnoldi iteration, and/or Fourier averaging to determine the eigenvalue $\lambda_k$ of Equation (2).

The value of the growth rate may indicate whether a power source and/or power sink is stable or unstable. For example, if the growth rate value is 1, then this indicates that the amplitude of the oscillating signal is staying the same and the power source and/or power sink is stable. If the growth rate value is less than 1 (e.g., the amplitude of the oscillating signal is decaying) or greater than 1 (e.g., the amplitude of the oscillating signal is growing), then this indicates that the power source and/or power sink is unstable.

Generally, based on the value of the growth rate, the stability analyzer 142 may assign an stability ranking to the power source and/or power sink. For example, a lower ranking (e.g., where 0 is the highest ranking, the color white is the highest ranking, etc.) may be assigned to a power source and/or power sink the greater the difference between the growth rate value and 1. Alternatively, the stability analyzer 142 may assign a stability ranking to the power source and/or power sink such that a higher ranking may be assigned to a power source and/or power sink the greater the difference between the growth rate value and 1. However, as described above, the stability analyzer 142 may calculate a plurality of Koopman modes for a power source and/or power sink. Furthermore, each Koopman mode may produce a plurality of growth rate values (e.g., one per physical data type that is used to calculate the Koopman modes). Thus, the stability analyzer 142 may determine several growth rate values associated with a single power source and/or power sink. Accordingly, the stability analyzer 142 may assign a plurality of instability (or stability) rankings to a single power source and/or power sink, where each ranking is associated with a type of physical data originating from or associated with the respective power source and/or power sink and/or is associated with a frequency (e.g., similar to the amplitude and phase matrices described above). Alternatively, the stability analyzer 142 may aggregate the growth rate values such that a single instability (or stability) ranking is assigned to a single power source and/or power sink (e.g., by averaging growth rate values and assigning a rank based on the averaged growth rate value, by taking the growth rate value farthest from 1 and assigning a rank based on that growth rate value, by taking the growth rate value associated with a physical data type most closely associated with determining stability and assigning a rank based on that growth rate value, etc.). The rankings may be displayed in an interactive user interface viewable on the user device 160, as described in greater detail below.

In further embodiments, the stability analyzer 142 can identify when a power source and/or power sink is in danger of failing using the results of the Koopman mode analysis. For example, the stability data database 145 may store information identifying stability limits for various power sources and/or power sinks. Such stability limits may include the value of a physical data type that, when reached, is known to cause a failure of the component or the failure of other components. Because the stability analyzer 142 determines amplitudes, phases, growth rate values, and frequency values, the stability analyzer 142 can estimate a time when a stability limit may be reached or an amount of time until a stability limit may be reached, if at all. The amplitudes may serve as a starting point. The growth rate values may identify the rate at which the amplitudes may be increasing, decreasing, or staying the same (e.g., how much an amplitude increases, decreases, or stays the same each time the signal oscillates to a peak). Thus, the stability analyzer 142 may use the growth rate values to determine a threshold number of peaks that need to be reached before the amplitude increases or decreases enough to reach the stability limit. Finally, the frequency values may identify the frequency of oscillation, thereby indicating how quickly the signal oscillates to a peak. Thus, the stability analyzer 142 can use the frequency values to identify how quickly the threshold number of peaks will be reached, thereby providing an estimate of a time when a stability limit may be reached or an amount of time until an stability limit may be reached. The stability analyzer 142 may generate notifications to indicate such times, as described in greater detail below.

The stability analyzer 142 also causes other components to take action to prevent instability or to reduce the likelihood that instability occurs. For example, the stability analyzer 142 may instruct one or more local controllers (e.g., in the control system 130) that are synchronized in action to counteract the instability exhibited by a power source and/or power sink (e.g., to cancel out the instability). The instructions sent to the one or more local controllers may cause the unstable power source and/or power sink or other power sources and/or power sinks that affect the unstable power source and/or power sink to adjust operation such that behavior is exhibited that has the distributed shape of the underlying unstable Koopman mode of the unstable power source and/or power sink (e.g., the Koopman mode that causes the stability analyzer 142 to determine that the power source and/or power sink may be unstable), but of opposite sign. Thus, the instructions may cause one or more local controllers to cancel or oppose the distributed shape of the underlying unstable Koopman mode.

Based on the relative stability of power sources and/or power sinks in the energy system 110, the stability analyzer 142 can instruct the SCADA system 150 or the control system 130 to instruct the storage system 152 to release energy into the power grid. For example, if the results of the Koopman mode analysis indicate that the power sources and/or power sinks are at a stability level in which it may be desirable to release additional energy into the power grid, then the stability analyzer 142 may generate corresponding control sequences (e.g., if the stability level or stability ranking is below a threshold value, indicating that the power source and/or power sink is more unstable than some baseline stability value, then the stability analyzer 142 generates control sequence(s) to release additional energy into the power grid to alleviate or counteract the instability). Likewise, the stability analyzer 142 may instruct the SCADA system 150 or the control system 130 to instruct power sources to store energy in the storage system 152 if the power sources and/or power sinks are at a stability level in which it is desirable to store excess power (e.g., if the stability level or stability ranking is above a threshold value, indicating that the power source and/or power sink is more stable than some baseline stability value, then the stability analyzer 142 generates control sequence(s) to store energy for later use).

The stability analyzer 142 can also instruct the SCADA system 150 or the control system 130 to instruct the storage system 152 to release energy into the power grid based on the values of physical data. For example, the energy stored in the storage system 152 can be used to reduce voltage variability in the energy system 110 if the energy is released at times or in a manner that reduces troughs or peaks in generated voltages. Thus, if the power quality in the energy system 110 is below a threshold value, then the stability analyzer 142 generates control sequence(s) to release a sufficient amount of energy to increase the power quality to above the threshold value.

In further embodiments, the stability simulator 144 instructs the SCADA system 150 or the control system 130 to instruct the storage system 152 to release or store energy based on simulated demand conditions and/or simulated energy generation conditions to balance loads in the power grid of the energy system 110. For example, the stability simulator 144 can use the results of the Koopman mode analysis to simulate expected energy demand (which is determined based on the amplitudes, phases, growth rates, and/or frequencies associated with power sinks as determined using the Koopman mode analysis, weather conditions, expected changes to the power grid, and/or the like) and use a Koopman mode analysis to correlate the expected energy demand to environmental conditions (e.g., identify amplitude, phase, growth rate, and/or frequency values during certain environmental conditions). During periods of high expected demand, the stability simulator 144 may generate control sequence(s) to instruct the storage system 152 to release stored energy at the time of high expected demand to provide additional energy supply. Likewise, during off-peak hours with low demand, the stability simulator 144 may generate control sequence(s) to instruct the storage system 152 to store energy using the determined correlation (or not release any energy). As another example, the stability simulator 144 can use the results of the Koopman mode analysis to forecast an amount of energy expected to be generated by renewable energy sources (which is determined based on the amplitudes, phases, growth rates, and/or frequencies associated with power sources and/or power sinks that generate renewable energy as determined using the Koopman mode analysis, weather conditions, expected changes to the power grid, and/or the like) and use a Koopman mode analysis to correlate the forecasted amount of energy from renewable energy sources to environmental conditions. During periods in which a high amount of energy is expected to be generated by renewable energy sources (e.g., sunny days, windy days, etc.), then the stability simulator 144 generates control sequence(s) to instruct the storage system 152 to store energy (and/or not release energy). During periods in which a low amount of energy is expected to be generated by renewable energy sources (e.g., cloudy days, non-windy days, etc.), then the stability simulator 144 generates control sequence(s) to instruct the storage system 152 to release energy into the energy system 110.

In additional embodiments, the stability simulator 144 can generate control sequence(s) to instruct the storage system 152 to release or store energy based on estimated costs. For example, if the cost of energy is expected to be high at a certain time and a spike in energy usage by a power sink occurs at that time, the storage system 152 (which may be located local to the power sink) may be instructed to release energy to reduce the energy used by the power sink that originates from other power sources in the energy system 110 (to reduce the power sink's cost for using energy). Likewise, if the cost of energy is expected to be low in the future, the stability simulator 144 may instruct the storage system 152 to store energy at that time given that the cost of energy from the energy system 110 is lower and thus the cost to store energy is lower.

Example User Interfaces

Figure 2A:
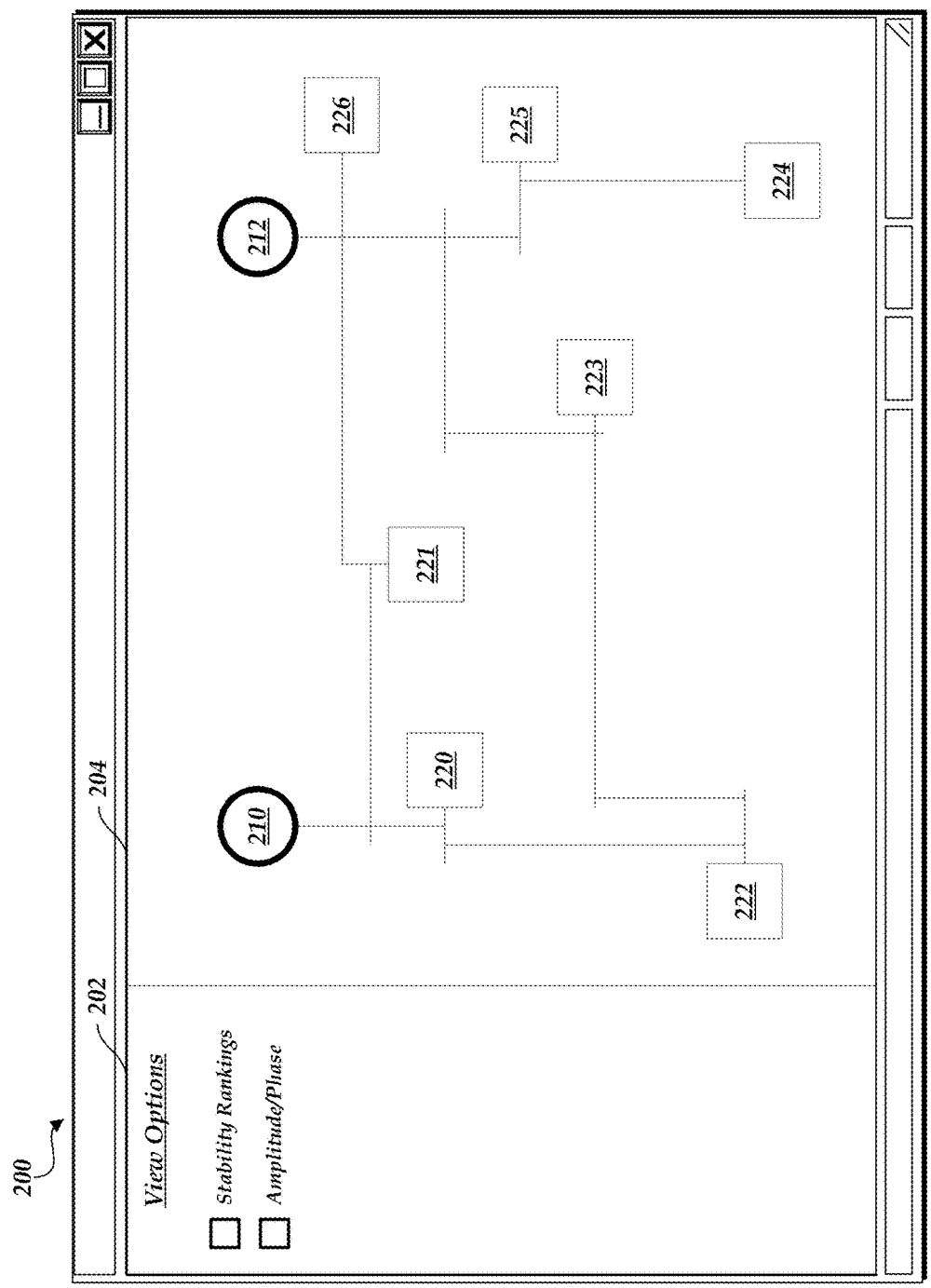
FIGS. 2A-2G illustrates an example user interface displaying the relative location of power sources and power sinks in an energy system, such as the energy system of FIG. 1.

FIGS. 2A-2G illustrates an example user interface 200 displaying the relative location of power sources 210 and 212 and power sinks 220-226 in an energy system, such as the energy system 110 of FIG. 1. The user interface 200 may be generated by the stability monitoring and analysis server 140 and displayed by the user device 160. The user interface 200 may include a window 202 and a window 204. The window 202 may include a plurality of selectable options for manipulating the information displayed in the window 204. As illustrated in FIG. 2A, the window 204 displays the relative location of the power sources 210 and 212 and power sinks 220-226 in a two-dimensional grid map or topology. However, this is not meant to be limiting. The user interface 200 may alternatively display the relative location of the power sources 210 and 212 and power sinks 220-226 in a three-dimensional grid map or topology, in a two-dimensional geographical map, in a three-dimensional geographic map, in a two-dimensional system schematic (e.g., a building and/or grid devices interaction schematic, an energy flow schematic, a map of different components, devices, or variables positioned on a spatial two-dimensional or three-dimensional plot, etc.), in a three-dimensional system schematic, and/or the like while providing the functionality described herein with respect to FIGS. 2A-2G.

Figure 2B:
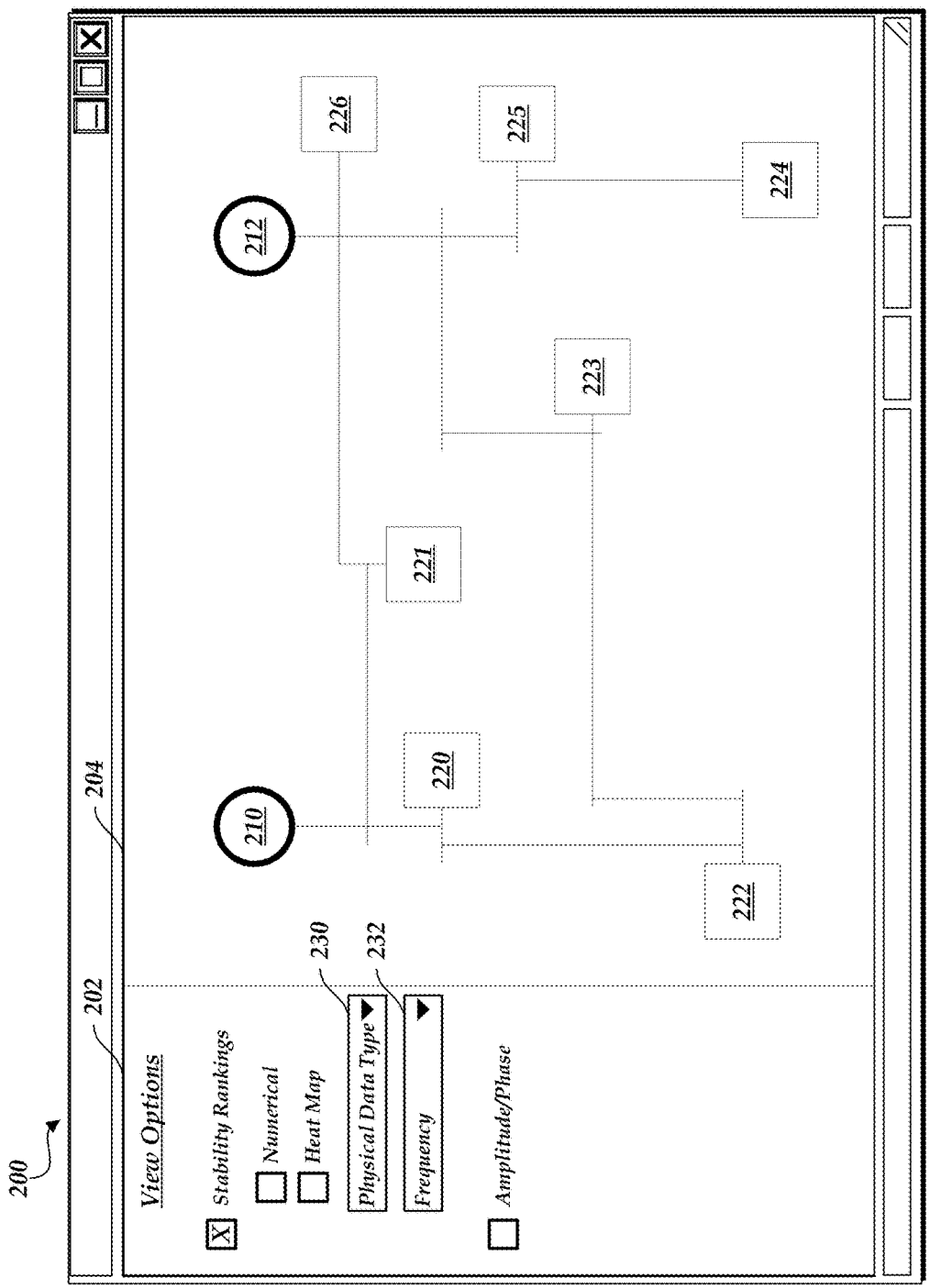

In an embodiment, the window 202 includes an option to view stability (or instability) rankings generated by the stability analyzer 142. For example, the option, when selected by a user, may cause the window 202 to display additional options that may be selectable by a user, as illustrated in FIG. 2B. Alternatively, not shown, the additional options may be present regardless of whether the stability rankings option is selected. The additional options may include the option to view the stability rankings as a numerical value or as a color in a heat map. The additional options may also include the option to choose which physical data type (e.g., via dropdown menu 230) and/or which frequency (e.g., via dropdown menu 232) for which to display the stability rankings.

Figure 2C:
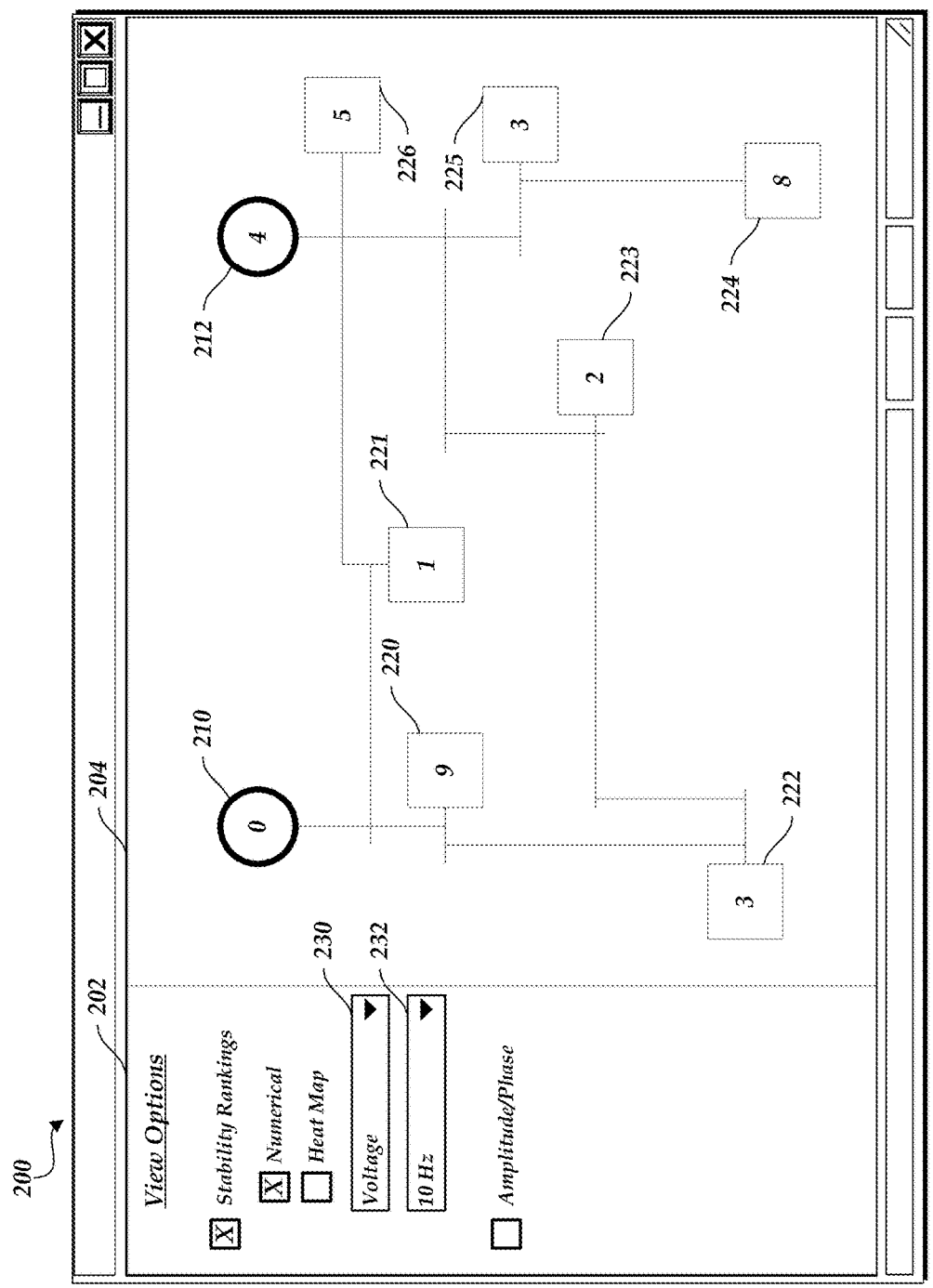

As an example, selection of the numerical value option, the voltage physical data type, and a frequency of 10 Hz causes the window 204 to display a numerical value representing the ranking assigned by the stability analyzer 142 to the power sources 210 and 212 and the power sinks 220-226 for such parameters, as illustrated in FIG. 2C. As illustrated in FIG. 2C, a lower number represents a higher ranking (and thus higher determined stability). Alternatively, not shown, a lower number can represent a lower ranking (and thus lower determined stability). The rankings may be unique (e.g., no two power sources, no two power sinks, and/or no two power sources or power sinks may share the same ranking), which means the stability analyzer 142 assigns the rankings based on the relative value of the growth rate for each of the power sources and/or power sinks, or the rankings may not be unique (e.g., two power sources or power sinks can share the same ranking).

Figure 2D:
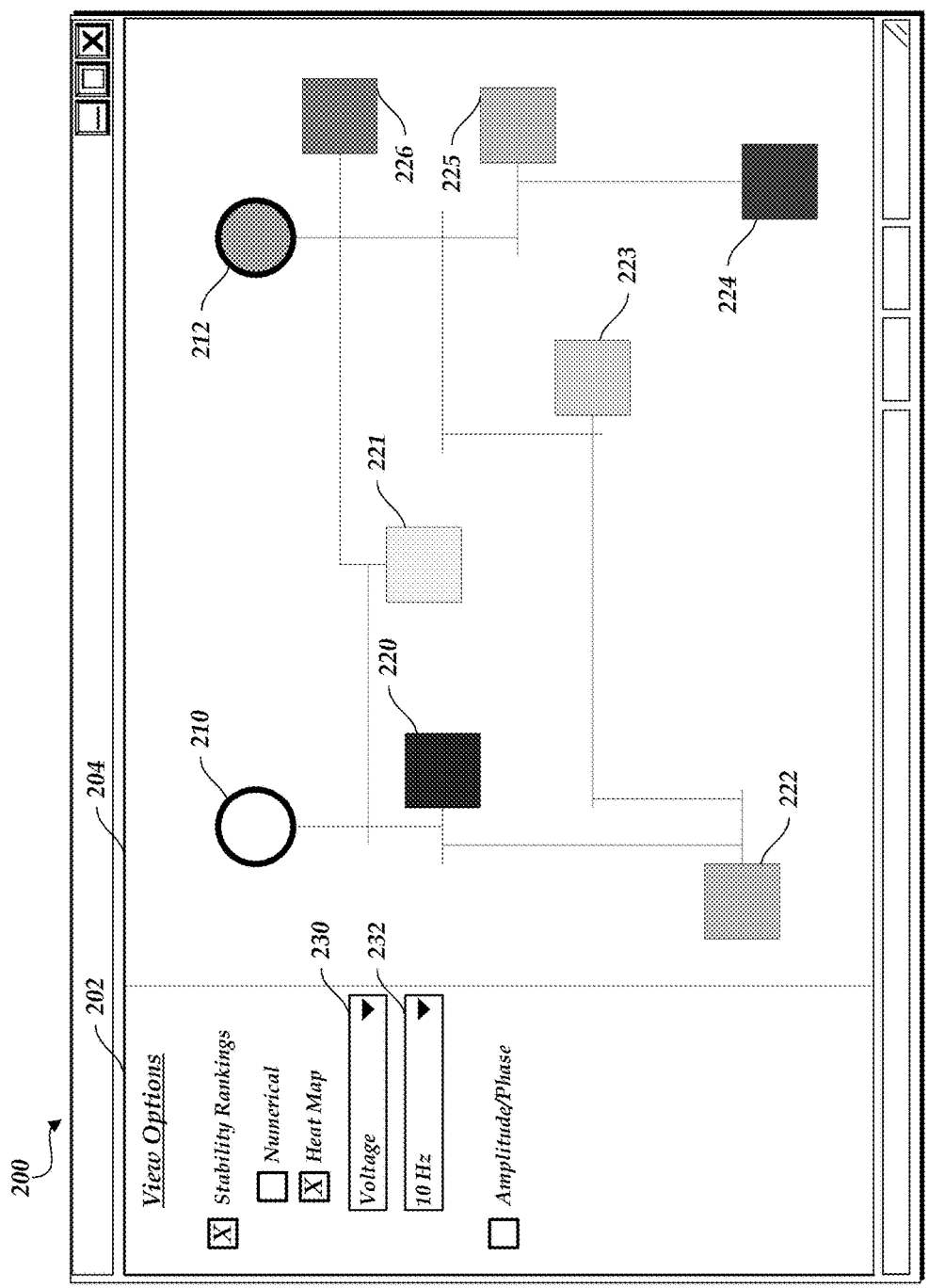

As another example, selection of the heat map option, the voltage physical data type, and a frequency of 10 Hz causes the window 204 to shade the representation of the power sources 210 and 212 and the power sinks 220-226 a color that represents the ranking assigned to the respective entity by the stability analyzer 142, as illustrated in FIG. 2D. As illustrated in FIG. 2D, a lighter color represents a higher ranking (and thus higher determined stability). Alternatively, not shown, a lighter color can represent a lower ranking (and thus lower determined stability).

In an embodiment, any of the power sources 210 and 212 or the power sinks 220-226 are selectable in the window 204 to view additional information. For example, the user may select the representation of the power source 210 in the window 204 to view additional information, such as the results of the calculations performed by the stability analyzer 142, reasons why the power source 210 was assigned its ranking, an estimated time at which the power source 210 (or another component) may fail, an estimated time until the power source 210 (or another component) may fail, and/or the like.

Figure 2E:
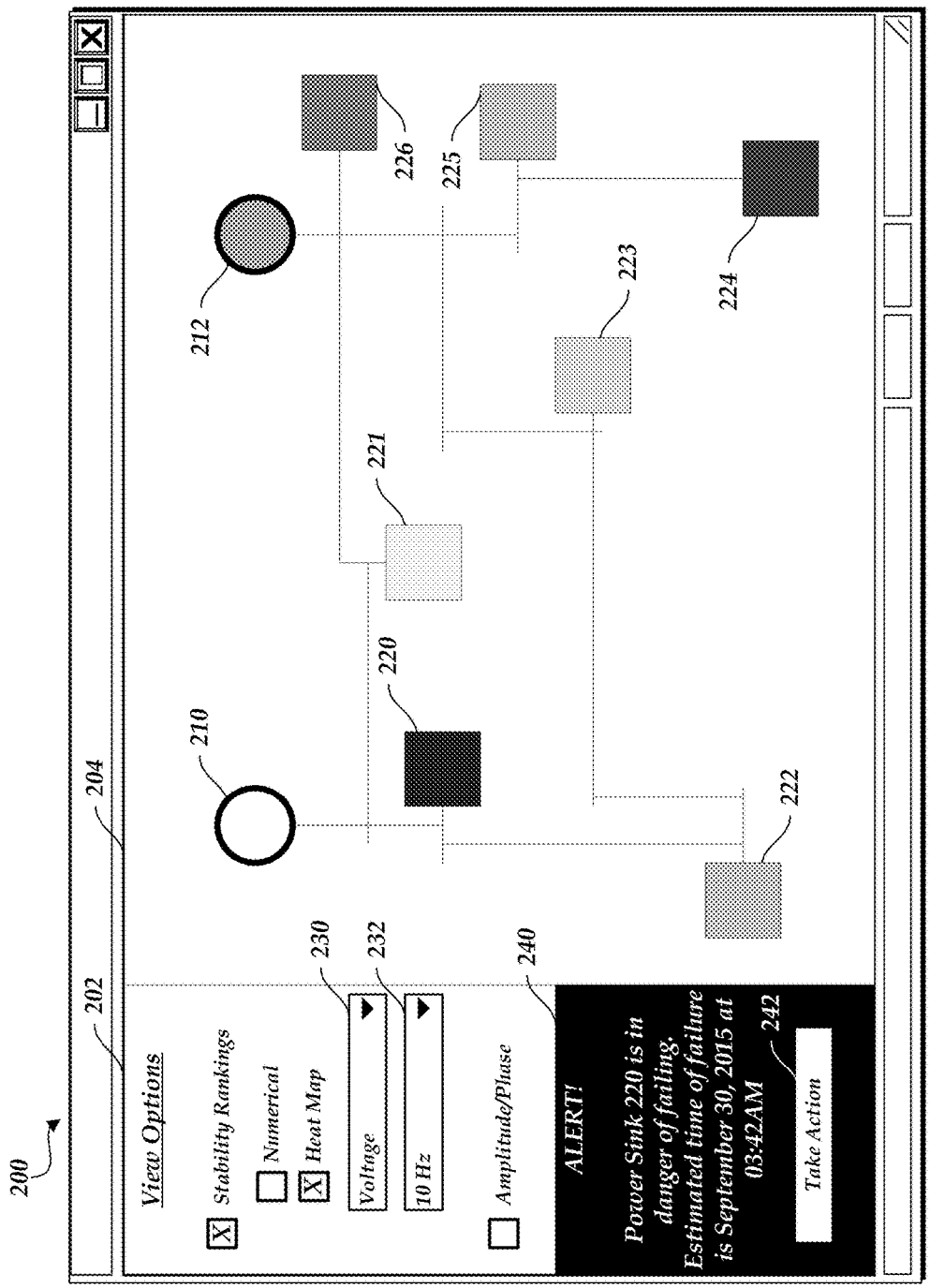

In further embodiments, when an estimated failure time is determined and/or when an estimated failure time is imminent, the user interface 200 displays a notification or alert 240, as illustrated in FIG. 2E. The alert 240 may identify the power source and/or power source in danger of failing and the expected time of failure. The alert 240 may also include a button 242 that, when selected, allows the user to take action by manually reallocating power resources to try to prevent the failure and/or that prompts the stability monitoring and analysis server 140 to automatically reallocate power resources to try to prevent the failure (e.g., by sending commands to actuators or other control systems in the energy system 110, by sending commands to the control system 130, etc., where the commands cause the shutdown of power sources and/or power sinks or the adjustment in behavior of power sources and/or power sinks to counteract and cancel unstable behavior). In alternative embodiments, the stability monitoring and analysis server 140 automatically reallocates power resources without waiting for or receiving a prompt from the user (e.g., via the selection of the button 242).

In other embodiments, not shown, the numerical stability rankings and the heat map color-coded stability rankings are displayed simultaneously in the window 204 or in the window 204 and another window in the user interface 200. For example, the two-dimensional grid map or topology may be replicated so that one version includes the numerical stability rankings and the other version includes the colored shading associated with the heat map.

Figure 2F:
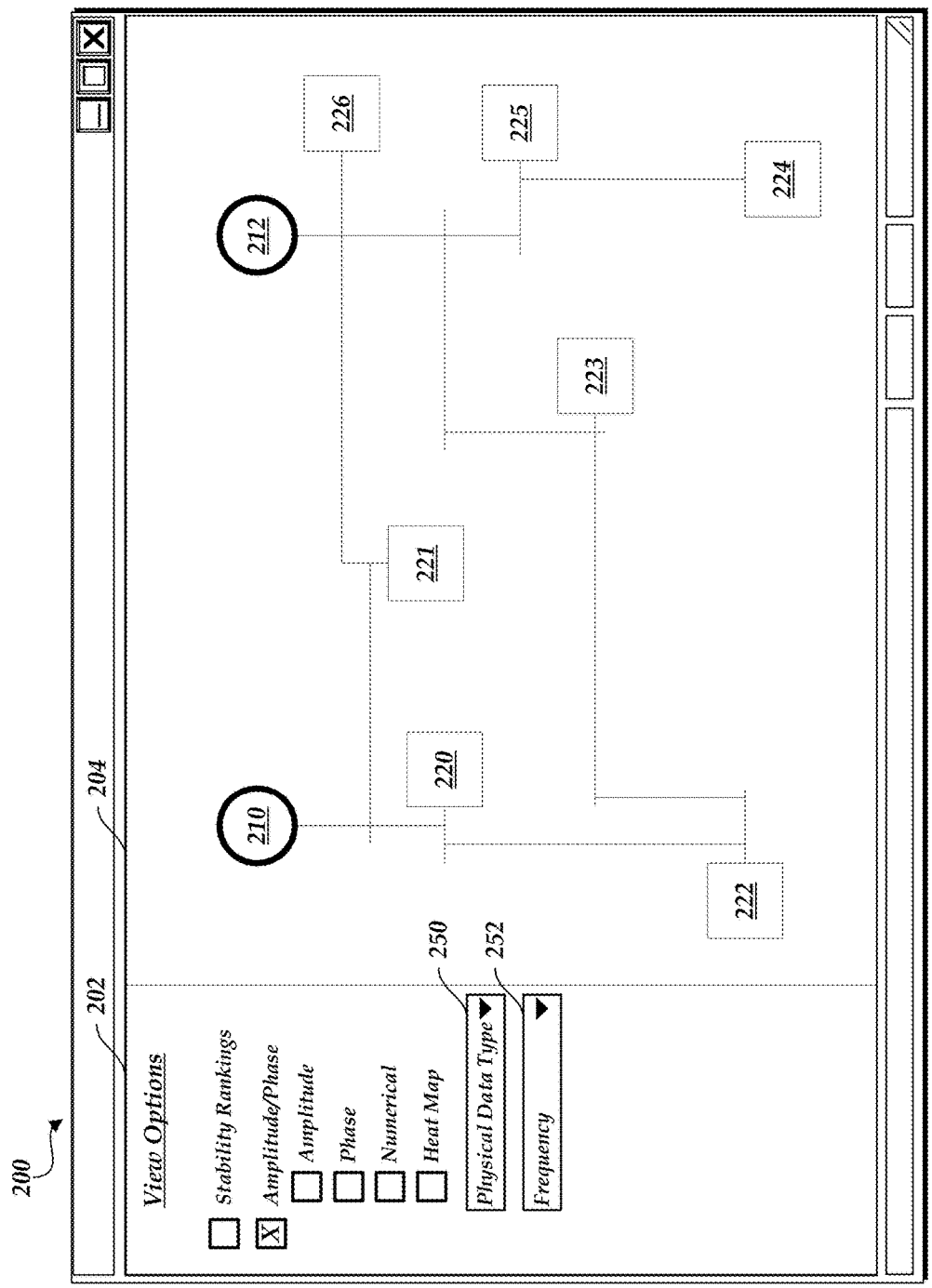

In an embodiment, the window 202 also includes an option to view amplitude and/or phase data for the power sources 210 and 212 and power sinks 220-226. Similar to the stability rankings option, the amplitude and/or phase option, when selected by a user, may cause the window 202 to display additional options that may be selectable by a user, as illustrated in FIG. 2F. Alternatively, not shown, the additional options may be present regardless of whether the amplitude and/or phase option is selected. The additional options may include the option to view amplitude data, phase data, the amplitude and/or phase as a numerical value, or the amplitude and/or phase as a color in a heat map. The numerical value option may appear similar to what is depicted in FIG. 2C. Likewise, the heat map option may appear similar to what is depicted in FIG. 2D. The additional options may also include the option to choose which physical data type (e.g., via dropdown menu 250) and/or which frequency (e.g., via dropdown menu 252) for which to display the amplitude and/or phase. Alerts may be generated and displayed in the user interface 200 if, for example, the stability analyzer 142 determines that the amplitude and/or phase values of one or more power sources and/or power sinks 220-226 may cause future issues or failures. The alerts may appear similar to the alert 240.

Figure 2G:
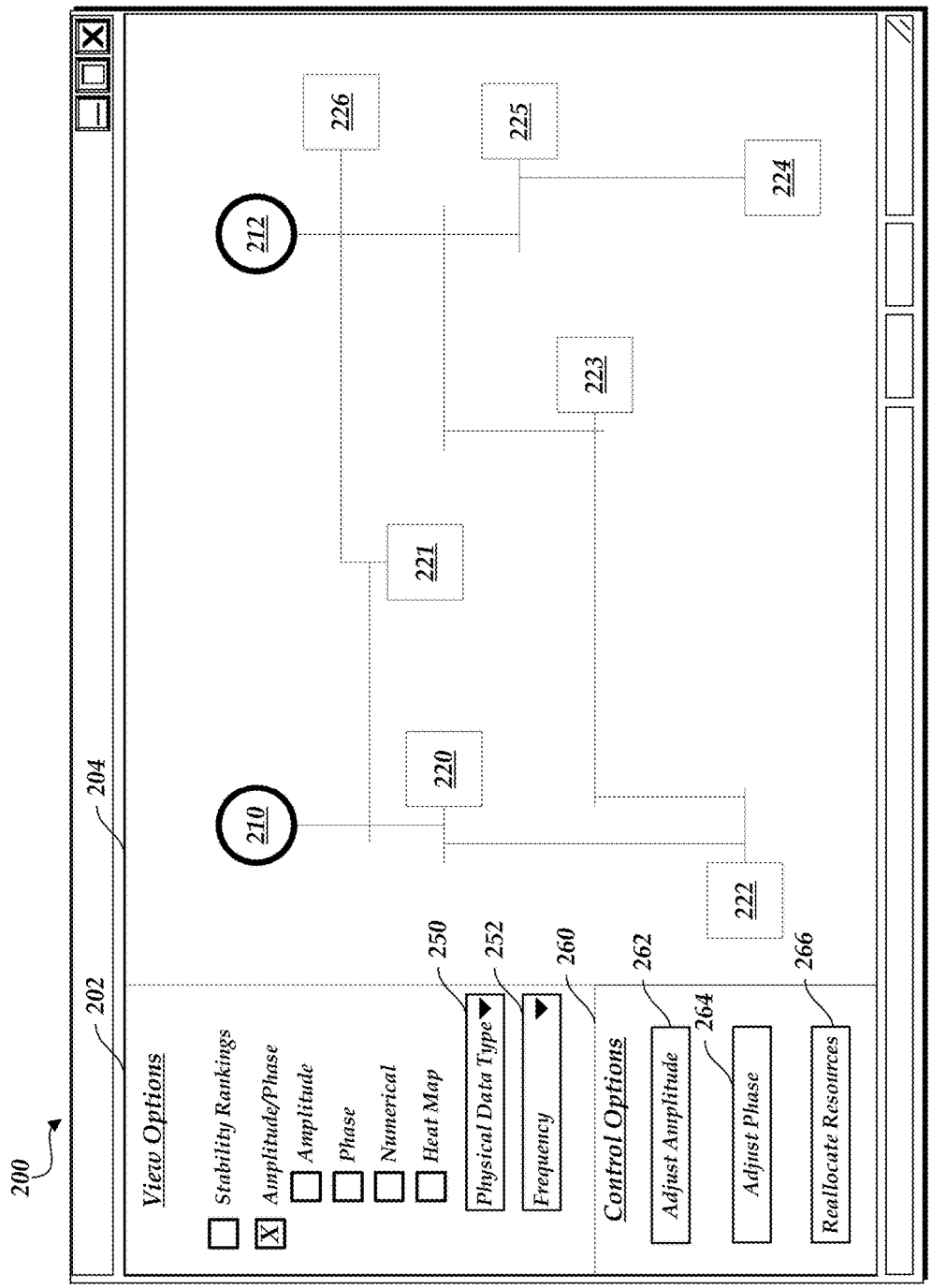

The user interface 200 may further include a window 260 that allows a user to control the behavior of one or more power sources 210 and 212 or power sinks 220-226, as illustrated in FIG. 2G. For example, after viewing the phase data, the user may notice that the phase is too similar for two or more power sources 210 and 212 or power sinks 220-226 and that one or more of the components should be instructed to change their behavior. Accordingly, the window 260 may include an amplitude adjustment button 262, a phase adjustment button 264, a power resources reallocation button 266, and/or the like that can be used to change the behavior of one or more selected power sources 210 and 212 or power sinks 220-226.

In further embodiments, the user interface 200 may display the results of a simulation performed by the stability simulator 144 in the same or similar manner as data is displayed in FIGS. 2A-2G. For example, the user interface 200 may display stability rankings and/or amplitude and/or phase data for power sources 210 and 212 and power sinks 220-226 under different simulated demand conditions or during different stages of a blackout simulation.

As another example, the user interface 200 may also allow a user to introduce new power sources and/or power sinks into the energy system (e.g., by dragging and dropping a power source or power sink into the window 204) and set parameters for the new power sources and/or power sinks. The stability simulator 144 may simulate how this affects the existing power sources 210 and 212 and power sinks 220-226, and the results of the simulation may be provided in the window 204. Thus, the user may be able to simulate and view forecasted capacity issues.

As another example, the user interface 200 may allow the user to provide energy prices for various periods of time during a day, week, year, etc. (or the stability monitoring and analysis server 140 may retrieve such data via the network 120) and the stability simulator 144 may use the energy prices to estimate and display energy costs during various periods of time during a day, week, year, etc. The stability simulator 144 may further determine ways in which energy use can be minimized during periods of high energy costs and display such results in the user interface 200. In addition, oscillatory Koopman mode magnitudes obtained by Fourier analysis or other computational methods can be used by the stability simulator 144 to set energy prices.

Example Process for Rectifying Physical Data

Figure 3:
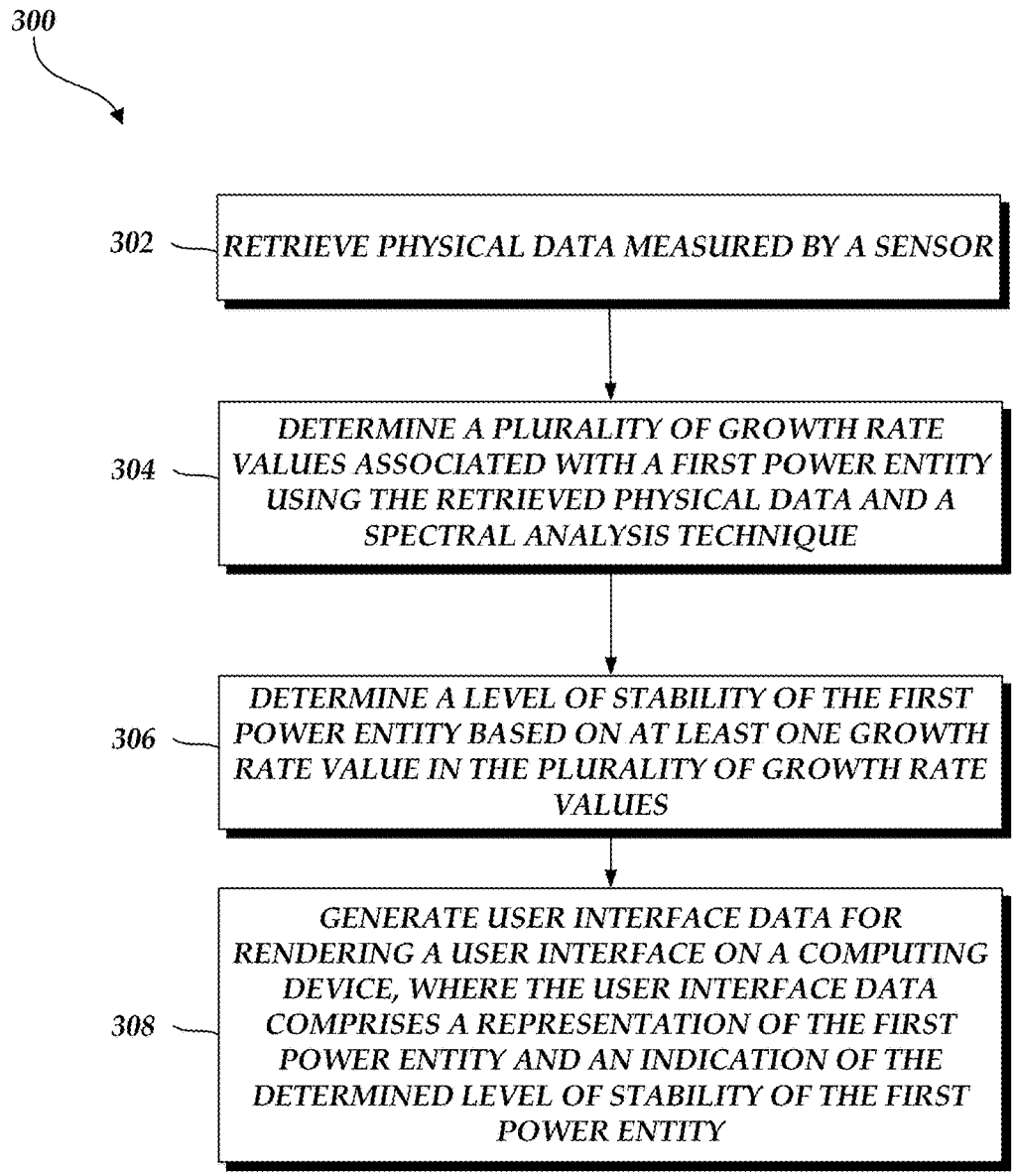
FIG. 3 illustrates a process that may be used by the stability monitoring and analysis server to determine a level of stability of a power source or power sink.

FIG. 3 illustrates a process 300 that may be used by the stability monitoring and analysis server 140 to determine a level of stability of a power source or power sink. As an example, the stability analyzer 142 of FIG. 1 can be configured to implement the process 300. The process 300 begins at block 302.

At block 302, physical data measured by a sensor is retrieved. The physical data may be retrieved from a SCADA system, such as the SCADA system 150, or from a database, such as the stability data database 145. The physical sensor may be a component included in an energy system, such as the energy system 110.

At block 304, a plurality of growth rate values associated with a first power entity are determined using the retrieved physical data and a spectral analysis technique. For example, the spectral analysis technique may be a Koopman mode analysis and the Koopman mode analysis may be applied to the retrieved physical data to determine the plurality of growth rate values. Each of the growth rate values may correspond with a specific frequency in a range of frequencies. The first power entity may be a power source or a power sink.

At block 306, a level of stability of the first power entity is determined based on at least one growth rate value in the plurality of growth rate values. For example, the growth rate values may be aggregated to determine the level of stability. The level of stability may be represented numerically or as a color (e.g., in a heat map).

At block 308, user interface data for rendering a user interface on a computing device is generated. The user interface data may include a representation of the first power entity and an indication of the determined level of stability of the first power entity. For example, the user interface may display a map, such as a geographical or grip map, or a schematic diagram and the representation of the first power entity may be positioned in the map or schematic diagram at a location that corresponds with a physical, geographic location of the first power entity. The indication of the determined level of stability may be numerical, a color, or any such identifiable marking.

Additional Embodiments

The stability monitoring and analysis server 140 of FIG. 1 may be a single computing device, or it may include multiple distinct computing devices, such as computer servers, logically or physically grouped together to collectively operate as a server system. The components of the stability monitoring and analysis server 140 can each be implemented in application-specific hardware (e.g., a server computing device with one or more ASICs) such that no software is necessary, or as a combination of hardware and software. In addition, the modules and components of the stability monitoring and analysis server 140 can be combined on one server computing device or separated individually or into groups on several server computing devices. In some embodiments, the stability monitoring and analysis server 140 may include additional or fewer components than illustrated in FIG. 1.

In some embodiments, the features and services provided by the stability monitoring and analysis server 140 may be implemented as web services consumable via the communication network 120. In further embodiments, the stability monitoring and analysis server 140 is provided by one more virtual machines implemented in a hosted computing environment. The hosted computing environment may include one or more rapidly provisioned and released computing resources, which computing resources may include computing, networking and/or storage devices. A hosted computing environment may also be referred to as a cloud computing environment.

Terminology

All of the methods and tasks described herein may be performed and fully automated by a computer system. The computer system may, in some cases, include multiple distinct computers or computing devices (e.g., physical servers, workstations, storage arrays, cloud computing resources, etc.) that communicate and interoperate over a network to perform the described functions. Each such computing device typically includes a processor (or multiple processors) that executes program instructions or modules stored in a memory or other non-transitory computer-readable storage medium or device (e.g., solid state storage devices, disk drives, etc.). The various functions disclosed herein may be embodied in such program instructions, and/or may be implemented in application-specific circuitry (e.g., ASICs or FPGAs) of the computer system. Where the computer system includes multiple computing devices, these devices may, but need not, be co-located. The results of the disclosed methods and tasks may be persistently stored by transforming physical storage devices, such as solid state memory chips and/or magnetic disks, into a different state. In some embodiments, the computer system may be a cloud-based computing system whose processing resources are shared by multiple distinct business entities or other users.

Depending on the embodiment, certain acts, events, or functions of any of the processes or algorithms described herein can be performed in a different sequence, can be added, merged, or left out altogether (e.g., not all described operations or events are necessary for the practice of the algorithm). Moreover, in certain embodiments, operations or events can be performed concurrently, e.g., through multi-threaded processing, interrupt processing, or multiple processors or processor cores or on other parallel architectures, rather than sequentially.

The various illustrative logical blocks, modules, routines, and algorithm steps described in connection with the embodiments disclosed herein can be implemented as electronic hardware (e.g., ASICs or FPGA devices), computer software that runs on general purpose computer hardware, or combinations of both. To clearly illustrate this interchangeability of hardware and software, various illustrative components, blocks, modules, and steps have been described above generally in terms of their functionality. Whether such functionality is implemented as specialized hardware versus software running on general-purpose hardware depends upon the particular application and design constraints imposed on the overall system. The described functionality can be implemented in varying ways for each particular application, but such implementation decisions should not be interpreted as causing a departure from the scope of the disclosure.

Moreover, the various illustrative logical blocks and modules described in connection with the embodiments disclosed herein can be implemented or performed by a machine, such as a general purpose processor device, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor device can be a microprocessor, but in the alternative, the processor device can be a controller, microcontroller, or state machine, combinations of the same, or the like. A processor device can include electrical circuitry configured to process computer-executable instructions. In another embodiment, a processor device includes an FPGA or other programmable device that performs logic operations without processing computer-executable instructions. A processor device can also be implemented as a combination of computing devices, e.g., a combination of a DSP and a microprocessor, a plurality of microprocessors, one or more microprocessors in conjunction with a DSP core, or any other such configuration. Although described herein primarily with respect to digital technology, a processor device may also include primarily analog components. For example, some or all of the signal processing algorithms described herein may be implemented in analog circuitry or mixed analog and digital circuitry. A computing environment can include any type of computer system, including, but not limited to, a computer system based on a microprocessor, a mainframe computer, a digital signal processor, a portable computing device, a device controller, or a computational engine within an appliance, to name a few.

The elements of a method, process, routine, or algorithm described in connection with the embodiments disclosed herein can be embodied directly in hardware, in a software module executed by a processor device, or in a combination of the two. A software module can reside in RAM memory, flash memory, ROM memory, EPROM memory, EEPROM memory, registers, hard disk, a removable disk, a CD-ROM, or any other form of a non-transitory computer-readable storage medium. An exemplary storage medium can be coupled to the processor device such that the processor device can read information from, and write information to, the storage medium. In the alternative, the storage medium can be integral to the processor device. The processor device and the storage medium can reside in an ASIC. The ASIC can reside in a user terminal. In the alternative, the processor device and the storage medium can reside as discrete components in a user terminal.

Conditional language used herein, such as, among others, "can," "could," "might," "may," "e.g.," and the like, unless specifically stated otherwise, or otherwise understood within the context as used, is generally intended to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without other input or prompting, whether these features, elements and/or steps are included or are to be performed in any particular embodiment. The terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list.

Disjunctive language such as the phrase "at least one of X, Y, Z," unless specifically stated otherwise, is otherwise understood with the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

While the above detailed description has shown, described, and pointed out novel features as applied to various embodiments, it can be understood that various omissions, substitutions, and changes in the form and details of the devices or algorithms illustrated can be made without departing from the spirit of the disclosure. As can be recognized, certain embodiments described herein can be embodied within a form that does not provide all of the features and benefits set forth herein, as some features can be used or practiced separately from others. The scope of certain embodiments disclosed herein is indicated by the appended claims rather than by the foregoing description. All changes which come within the meaning and range of equivalency of the claims are to be embraced within their scope.

What is claimed is:

1. A system for stability monitoring, analysis, and control in an energy system, the system comprising:
   a computer data repository configured to store physical data measured by at least one physical sensor; and
   a computing system comprising one or more computing devices, the computing system in communication with the computer data repository and programmed to implement:
   a stability analyzer configured to:
      retrieve the physical data from the computer data repository, wherein the physical data corresponds to a first power entity, and wherein the physical data comprises data of a first type;
      determine a plurality of growth rate values and a plurality of frequency values associated with the first power entity using the retrieved physical data and a spectral analysis technique, wherein each growth rate value in the plurality of growth rate values is associated with a frequency in a range of frequencies, and wherein each frequency value in the plurality of frequency values is associated with a frequency in the range of frequencies;
      determine a level of stability of the first power entity based on at least one growth rate value in the plurality of growth rate values;
      generate user interface data for rendering a user interface on a computing device, wherein the user interface data comprises a representation of the first power entity and an indication of the determined level of stability of the first power entity; and
      control the first power entity based on the determined level of stability of the first power entity.

2. The system of claim 1, wherein the stability analyzer is further configured to assign a stability rank to the first power entity based on the determined level of stability of the first power entity, wherein the indication of the determined level of stability comprises an indication of the assigned stability rank.

3. The system of claim 2, wherein a first color corresponds with the assigned stability rank, and wherein the representation of the first power entity is depicted in the first color.

4. The system of claim 1, wherein the spectral analysis technique comprises a Koopman mode analysis.

5. The system of claim 1, wherein the stability analyzer is further configured to receive, from a user, a request to adjust an actuator controlling the first power entity.

6. The system of claim 1, wherein the user interface data further comprises a list of selectable frequencies, and a list of selectable data types, and wherein the stability analyzer is further configured to:
   determine a plurality of amplitudes and a plurality of phases associated with the first power entity using a Koopman mode analysis applied to the retrieved physical data, wherein each amplitude in the plurality of amplitudes is associated with a frequency in the range of frequencies, and wherein each phase in the plurality of phases is associated with a frequency in the range of frequencies; and
   update, in response to a selection of a first frequency within the list of selectable frequencies and a selection of the first type within the list of selectable data types, the user interface data to include, in association with the representation of the first power entity, a representation of the amplitude in the plurality of amplitudes that is associated with the first frequency.

7. The system of claim 6, wherein the stability analyzer is further configured to:
   retrieve a stability limit associated with the first power entity;
   determine a time when the first power entity will reach the stability limit based on the plurality of growth rate values, the plurality of frequency values, and the plurality of amplitudes;
   generate an alert indicating the determined time; and
   update the user interface data to include the alert.

8. The system of claim 6, wherein the stability analyzer is further configured to:
   generate a control sequence based on the determined plurality of phases; and
   transmit the control sequence to a control system such that the control system can adjust operation of the first power entity.

9. The system of claim 8, wherein the control sequence includes an instruction that causes the first power entity to adjust operation in a way that opposes instability identified in the energy system.

10. The system of claim 1, wherein the user interface data comprises one of a geographical map, a grip map, or a system schematic, and wherein the representation of the first power entity is positioned in the user interface over the one of the geographical map, the grip map, or the system schematic at a location that corresponds with a physical location of the first power entity.

11. The system of claim 1, wherein the physical data comprises at least one of a value of voltages generated by the first power entity, a phase of the voltages generated by the first power entity, a value of current generated by the first power entity, a power level output by the first power entity, reactive power, apparent power, power quality, rotor angular position of a power source, rotor angular velocity of a power source, rotor frequency of a power source, mechanical input power of a power source, an amount of power demanded by the first power entity, an amount of power consumed by the first power entity, or social data.

12. The system of claim 1, wherein the stability analyzer is further configured to generate a control sequence that causes a storage system to release energy into the energy system based on the determined level of stability of the first power entity.

13. The system of claim 1, wherein the first power entity is one of a power source or a power sink.

14. A method for stability monitoring, analysis, and control in an energy system, the method comprising:
   as implemented by a computer system comprising one or more computing devices, the computer system configured with specific executable instructions,
   retrieving physical data, wherein the physical data is measured by at least one physical sensor and corresponds to a first power entity, and wherein the physical data comprises data of a first type;
   determining a plurality of growth rate values associated with the first power entity using the retrieved physical data and a spectral analysis technique, wherein one or more individual growth rate values in the plurality of growth rate values are associated with a frequency in a range of frequencies;
   determining a level of stability of the first power entity based on at least one growth rate value in the plurality of growth rate values;
   generating user interface data for rendering a user interface on a computing device, wherein the user interface data comprises a representation of the first power entity and an indication of the determined level of stability of the first power entity; and controlling the first power entity based on the determined level of stability of the first power entity.

15. The method of claim 14, further comprising assigning a stability rank to the first power entity based on the determined level of stability of the first power entity, wherein the indication of the determined level of stability comprises an indication of the assigned stability rank.

16. The method of claim 15, wherein a first color corresponds with the assigned stability rank, and wherein the representation of the first power entity is depicted in the first color.

17. The method of claim 14, wherein the spectral analysis technique comprises a Koopman mode analysis.

18. The method of claim 14, further comprising receiving, from a user, a request to adjust an actuator controlling the first power entity.

19. The method of claim 14, wherein the user interface data further comprises a list of selectable frequencies, and a list of selectable data types, and wherein the method further comprises:

determining a plurality of amplitudes associated with the first power entity using a Koopman mode analysis applied to the retrieved physical data, wherein one or more individual amplitudes in the plurality of amplitudes are associated with a frequency in the range of frequencies; and updating, in response to a selection of a first frequency within the list of selectable frequencies and a selection of the first type within the list of selectable data types, the user interface data to include, in association with the representation of the first power entity, a representation of the amplitude in the plurality of amplitudes that is associated with the first frequency.

20. The method of claim 19, further comprising:

retrieving a stability limit associated with the first power entity;

determining a time when the first power entity will reach the stability limit based on the plurality of growth rate values and the plurality of amplitudes;

generating an alert indicating the determined time; and updating the user interface data to include the alert.

21. The method of claim 19, further comprising:

generating a control sequence based on the determined plurality of amplitudes; and transmitting the control sequence to a control system such that the control system can adjust operation of the first power entity.

22. A non-transitory computer-readable medium having stored thereon an stability analyzer for determining stability of power entities, the stability analyzer comprising executable code that, when executed on a computing device, implements a process comprising:

retrieving physical data, wherein the physical data is measured by at least one physical sensor and corresponds to a first power entity, and wherein the physical data comprises data of a first type;

determining a plurality of growth rate values associated with the first power entity using the retrieved physical data and a spectral analysis technique, wherein one or more individual growth rate values in the plurality of growth rate values is associated with a frequency in a range of frequencies;

determining a level of stability of the first power entity based on at least one growth rate value in the plurality of growth rate values;

generating user interface data for rendering a user interface on a computing device, wherein the user interface data comprises a representation of the first power entity and an indication of the determined level of stability of the first power entity; and controlling the first power entity based on the determined level of stability of the first power entity.

* * * * *